(12) United States Patent
Zhu et al.

(10) Patent No.: US 12,284,858 B2
(45) Date of Patent: Apr. 22, 2025

(54) FLEXIBLE PEROVSKITE SOLAR CELLS AND FABRICATION THEREOF

(71) Applicant: City University of Hong Kong, Kowloon (HK)

(72) Inventors: Zonglong Zhu, Kowloon (HK); Danpeng Gao, Kowloon (HK); Bo Li, Kowloon (HK)

(73) Assignee: City University of Hong Kong, Kowloon (HK)

( * ) Notice: Subject to any disclaimer, the term of this patent is extended or adjusted under 35 U.S.C. 154(b) by 72 days.

(21) Appl. No.: 18/203,394

(22) Filed: May 30, 2023

(65) Prior Publication Data

US 2024/0407183 A1 Dec. 5, 2024

(51) Int. Cl.
*H10K 30/00* (2023.01)
*H01G 9/00* (2006.01)
*H01G 9/20* (2006.01)
*H10K 30/50* (2023.01)
*H10K 85/50* (2023.01)
*H10K 71/12* (2023.01)

(52) U.S. Cl.
CPC .......... *H10K 30/50* (2023.02); *H01G 9/0029* (2013.01); *H01G 9/2095* (2013.01); *H10K 85/50* (2023.02); *H10K 71/12* (2023.02)

(58) Field of Classification Search
CPC ...... H01L 31/00–078; Y02E 10/50–60; H10K 30/00–89; H10F 10/00–19; H10F 19/00–908; H10F 77/00–959

USPC .................................................. 136/243–265
See application file for complete search history.

(56) References Cited

FOREIGN PATENT DOCUMENTS

| CN | 115568237 A | * | 1/2023 |
| WO | 2019000642 A1 | | 1/2019 |
| WO | 2023273879 A1 | | 1/2023 |

OTHER PUBLICATIONS

Chen et al., Dually Modified Wide-Bandgap Perovskites by Phenylethylammonium Acetate toward High Efficiency Solar Cells with Low Photovoltage Loss, ACS Appl. Mater. Interfaces, 2022, 14, 43246-43256 (Year: 2022).*
Gong et al., Cictric Acid Modified Semi-embedded Silver Nanowires/ colorless Polyimide Transparent Conductive Substrates for Efficient Flexible Perovskite Solar Cells, RCS Adv., 2023, 13, 15531. (Year: 2023).*
CN-115568237-A English (Year: 2023).*
(Continued)

*Primary Examiner* — Bach T Dinh
(74) *Attorney, Agent, or Firm* — Renner, Kenner, Greive, Bobak, Taylor & Weber

(57) ABSTRACT

An ammonium acetate selected from the group of pentylammonium acetate, phenylethylammonium acetate, 2-([1,1'-biphenyl]-4-yl) ethan-1-amine acetate, butanammonium acetate, hexylammonium acetate, octylammonium acetate, phenylbutanammonium acetate, and any combination thereof, is used to modify a perovskite layer in a perovskite solar cell. A perovskite solar cell includes a perovskite layer and an interface modification layer that is in contact with the perovskite layer and includes at least one ammonium acetate provided herein. A method of preparing the inverted perovskite solar cell.

20 Claims, 10 Drawing Sheets

(56) References Cited

OTHER PUBLICATIONS

Martin Kaltenbrunner, et al., Flexible high power-per-weight perovskite solar cells with chromium oxide-metal contacts for improved stability in air, Nature Materials, vol. 14, Oct. 2015, 1032.

Xiaotian Hu, et al., Wearable Power Source: A Newfangled Feasibility for Perovskite Photovoltaics, ACS Energy Lett. 2019, 4, 1065-1072.

Zhen Li, et al., Hybrid Perovskite-Organic Flexible Tandem Solar Cell Enabling Highly Efficient Electrocatalysis Overall Water Splitting, Adv. Energy Mater. 2020, 10, 2000361.

Shengfan Wu, et al., Low-Bandgap Organic Bulk-Heterojunction Enabled Efficient and Flexible Perovskite Solar Cells, Adv. Mater. 2021, 33, 2105539.

Zhen Wen, et al., Self-powered textile for wearable electronics by hybridizing fiber-shaped nanogenerators, solar cells, and supercapacitors, Sci. Adv. 2016; 2: e1600097.

Li Rao, et al., Wearable Tin-Based Perovskite Solar Cells Achieved by a Crystallographic Size Effect, Angew. Chem. Int. Ed. 2021, 60, 14693-14700.

Byeong Jo Kim, et al., Highly efficient and bending durable perovskite solar cells: toward a wearable power source, Energy Environ. Sci., 2015, 8, 916.

Yiguo Yao, et al., Organic Hole-Transport Layers for Efficient, Stable, and Scalable Inverted Perovskite Solar Cells, Adv. Mater. 2022, 34, 2203794.

Yulan Huang, et al., Antisolvent Engineering to Optimize Grain Crystallinity and Hole-Blocking Capability of Perovskite Films for High-Performance Photovoltaics, Adv. Mater. 2021, 33, 2102816.

Xinyu Yu, et al., Dopant-free dicyanofluoranthene-based hole transporting material with low cost enables efficient flexible perovskite solar cells, Nano Energy 82 (2021) 105701.

Zhenghui Luo, et al., Designing a Perylene Diimide/Fullerene Hybrid as Effective Electron Transporting Material in Inverted Perovskite Solar Cells with Enhanced Efficiency and Stability, Angew. Chem. Int. Ed. 2019, 58, 8520 -8525.

Jing Wang, et al., Dopant-Free Hole-Transporting Material with Enhanced Intermolecular Interaction for Efficient and Stable n-i-p Perovskite Solar Cells, Adv. Energy Mater. 2021, 11, 2100967.

Xianglang Sun, et al., Efficient Inverted Perovskite Solar Cells with Low Voltage Loss Achieved by a Pyridine-Based Dopant-Free Polymer Semiconductor, Angew. Chem. Int. Ed. 2021, 60, 7227-7233.

Eui Dae Jung, et al., Multiply Charged Conjugated Polyelectrolytes as a Multifunctional Interlayer for Efficient and Scalable Perovskite Solar Cells, Adv. Mater. 2020, 32, 2002333.

Zhonghao Zheng, et al., Pre-Buried Additive for Cross-Layer Modification in Flexible Perovskite Solar Cells with Efficiency Exceeding 22%, Adv. Mater. 2022, 34, 2109879.

Hyun Suk Jung, et al., Flexible Perovskite Solar Cells, Joule 3, 1850-1880, Aug. 21, 2019.

Jaehoon Chung, et al., Record-efficiency flexible perovskite solar cell and module enabled by a porous-planar structure as an electron transport layer, Energy Environ. Sci., 2020, 13, 4854.

Zhen Li, et al., Sulfonated Graphene Aerogels Enable Safe-to-Use Flexible Perovskite Solar Modules, Adv. Energy Mater. 2022, 12, 2103236.

Ning Zhu, et al., High Efficiency (18.53%) of Flexible Perovskite Solar Cells via the Insertion of Potassium Chloride between $SnO_2$ and $CH_3NH_3PbI_3$ Layers, ACS Appl. Energy Mater. 2019, 2, 3676-3682.

Jiangshan Feng, et al., Record Efficiency Stable Flexible Perovskite Solar Cell Using Effective Additive Assistant Strategy, Adv. Mater. 2018, 30, 1801418.

Lu Yang, et al., Record-Efficiency Flexible Perovskite Solar Cells Enabled by Multifunctional Organic Ions Interface Passivation, Adv. Mater. 2022, 34, 2201681.

Feng Gao, et al., Recent Progresses on Defect Passivation toward Efficient Perovskite Solar Cells, Adv. Energy Mater. 2020, 10, 1902650.

Bo Li, et al., Efficient Passivation Strategy on Sn Related Defects for High Performance All-Inorganic $CsSnI_3$ Perovskite Solar Cells, Adv. Funct. Mater. 2021, 31, 2007447.

Xiangchuan Meng, et al., Stretchable Perovskite Solar Cells with Recoverable Performance, Angew. Chem. Int. Ed. 2020, 59, 16602-16608.

Hao Mei, et al., Synergistic engineering of bromine and cetyltrimethylammonium chloride molecules enabling efficient and stable flexible perovskite solar cells, J. Mater. Chem. A, 2020, 8, 19425.

Dong et al., Flexible perovskite solar cells with simultaneously improved efficiency, operational stability, and mechanical reliability, Joule 5, 1587-1601 Jun. 16, 2021 Elsevier Inc. https://doi.org/10.1016/j.joule.2021.04.014.

\* cited by examiner

FLEXIBLE PEROVSKITE SOLAR CELLS AND FABRICATION THEREOF

This invention was supported by the Hong Kong Innovation and Technology Support Programme (ITS/095/20).

FIELD OF THE INVENTION

The present invention relates to flexible perovskite solar cells.

BACKGROUND

Perovskite solar cells (PSCs) have emerged as one of the most promising thin-film photovoltaic (PV) technologies for commercial deployment due to their low cost, tunable optoelectronic properties and high power conversion efficiency (PCE) reaching 25.7%. Moreover, the low-temperature deposition and solution processability of perovskite films enable the fabrication of lightweight flexible PSCs, which are expected in a variety of applications such as portable power supply, wearable electronics and self-powered integrated devices. Among the PSCs, inverted (p-i-n) PSCs are compatible with the production of flexible PSCs due to the employment of low-temperature processed charge transporting materials such as poly(3,4-ethylenedioxy thiophene) polystyrene sulfonate (PEDOT:PSS), poly(triaryl amine) (PTAA), and $C_{60}$, etc. However, the record efficiency of flexible PSCs still lags far behind their rigid counterpart, hindering their applications in self-powered devices. Hence, it is imperative to develop effective strategy to further enhance the device performance.

Generally, to achieve high efficiency and excellent stability of PSCs, the undesirable defects that cause non-radiative recombination and accelerated ion migrate must be effectively passivated. Since grain boundaries are the locations where cracks are most easily generated under external strain, the passivation of defects in grain boundaries becomes increasingly important in flexible PSCs. Previous studies have realized highly efficient and mechanically stable flexible PSCs using different defects passivation materials, such as sulfonated graphene oxide,[1] self-healing polyurethane,[2] ammonium salt,[3] and 2D perovskites.[4] Nevertheless, there is a paucity of understanding on the design principle of passivation molecule, as well as highly effective passivation approaches to boost the efficiency over 23%. Therefore, there is a need to rationally design the structure of passivation molecules for the enhancement of both the efficiency and stability of flexible PSCs.

SUMMARY OF THE INVENTION

An embodiment of the present invention relates to use of an ammonium acetate selected from the group of pentylammonium acetate, phenylethylammonium acetate, 2-([1,1'-biphenyl]-4-yl) ethan-1-amine acetate, butanammonium acetate, hexylammonium acetate, octylammonium acetate, phenylbutanammonium acetate, and any combination thereof, to modify a perovskite layer in a perovskite solar cell.

Another embodiment of the present invention relates to a perovskite solar cell including a perovskite layer; and an interface modification layer that is in contact with the perovskite layer and includes at least one ammonium acetate selected from the group of pentylammonium acetate, phenylethylammonium acetate, 2-([1,1'-biphenyl]-4-yl) ethan-1-amine acetate, butanammonium acetate, hexylammonium acetate, octylammonium acetate, phenylbutanammonium acetate, and any combination thereof.

An embodiment of the present invention relates to a method of preparing an inverted perovskite solar cell including the steps of:
  providing a substrate layer;
  providing a transparent electrode on the flexible substrate layer;
  coating a hole transport layer onto the substrate layer;
  coating a perovskite layer;
  coating an electron transport layer onto the perovskite layer;
  coating a metal electrode on the electron transport layer:
in which, an interface modification layer is coated onto the hole transport layer prior to coating the perovskite layer, and/or coating onto the perovskite layer followed by coating the perovskite layer; and
in which the interface modification layer includes at least one ammonium acetate selected from the group of pentylammonium acetate, phenylethylammonium acetate, 2-([1,1'-biphenyl]-4-yl) ethan-1-amine acetate, butanammonium acetate, hexylammonium acetate, octylammonium acetate, phenylbutanammonium acetate, and any combination thereof.

Figure 1:
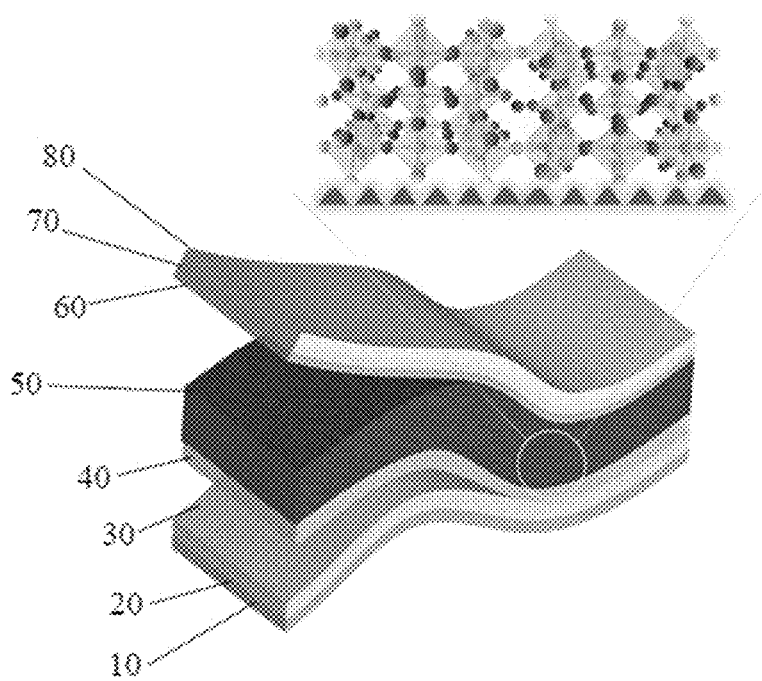
FIG. 1 shows schematic illustration of the device configuration of the PenAAc interface modified flexible PSCs.

The figures herein are for illustrative purposes only and are not necessarily drawn to scale.

DESCRIPTION OF THE PREFERRED EMBODIMENTS

Unless otherwise specifically provided, all tests herein are conducted at standard conditions which include a room and testing temperature of 25° C., sea level (1 atm.) pressure, pH 7, and all measurements are made in metric units. Furthermore, all percentages, ratios, etc. herein are by weight, unless specifically indicated otherwise. It is understood that unless otherwise specifically noted, the materials compounds, chemicals, etc. described herein are typically commodity items and/or industry-standard items available from a variety of suppliers worldwide.

As used herein, "ITO" refers to Indium Tin Oxide, "PEN" refers to Polyethylene Naphthalate, "PET" refers to Polyethylene Terephthalate, and "FTO" refers to Fluorine-doped Tin Oxide.

As used herein, a single dash, "-", or a double dash, "=", may be used before and/or after terms to indicate the bond order of the bond between the stated substituent and its parent moiety. A single dash represents a single bond, while a double dash represents a double bond. In the absence of a single or double dash, it is assumed that the substituent and its parent moiety form a single bond. Furthermore, unless a dash indicates otherwise, substituents are to be read "left to right."

As used herein, band gap or band gap energy ($E_G$) refers to the minimum amount of energy required for an electron to break free of its bound state.

1. Perovskite Composition

An embodiment of the present disclosure provides a new high-efficiency flexible perovskite composition $Cs_x(FA_yMA_{1-y})_{1-x}Pb(I_yBr_{1-y})_3$, in which x is from about 0 to about 0.15, and y is from about 0.85 to about 1, FA and MA denote formamidinium and methylamine, respectively. For example, in the empirical formula, x may be about 0.05, and y may be about 0.98.

In some embodiments, the perovskite composition may have a formula in conformity with $Cs_x(FA_yMA_{1-y})_{1-x}Pb(I_yBr_{1-y})_3$ (where x is about 0 to about 0.15, and y is about 0.85 to about 1), such as any of $FAPbI_3$, $Cs_{0.05}(FA_{0.98}MA_{0.02})_{0.95}Pb(I_{0.98}Br_{0.02})_3$, $Cs_{0.07}(FA_{0.85}MA_{0.15})_{0.93}Pb(I_{0.85}Br_{0.15})_3$, $Cs_{0.15}FA_{0.85}PbI_3$, $FA_{0.9}MA_{0.1}Pb(I_{0.9}Br_{0.1})_3$, $Cs_{0.05}(FA_{0.92}MA_{0.08})_{0.95}Pb(I_{0.92}Br_{0.08})_3$.

Without intending to be bound by theory, it is believed that with FAPbIs as the main body, part of FA$^+$ can be replaced by Cs$^+$ or MA$^+$ ions, and part of I$^-$ can be replaced by Br$^-$, such FAPbI$_3$ perovskite according to this invention may have one or more of the following advantages:

(1) High efficiency of photovoltaic conversion: the FAPbIs perovskite according to this invention can provide a photovoltaic conversion efficiency of up to about 25%, making it a very promising material for solar cell applications.

(2) Highly tunable band structure: the FAPbI$_3$ perovskite according to this invention may have a highly tunable band structure, allowing its optoelectronic properties to be optimized by adjusting its crystal structure and chemical composition.

(3) Highly stable structure: the crystal structure of the FAPbIs perovskite according to this invention is highly stable, enabling it to maintain its optoelectronic properties over a wide temperature and humidity range.

(4) Easy to prepare and process: the FAPbIs perovskite according to this invention can be prepared by a simple solution method and processed into thin films on various substrates, making it a very practical material.

(5) Low cost: compared to traditional silicon-based solar cell materials, the FAPbIs perovskite according to this invention may have a lower preparation cost, making it a competitive alternative in the solar cell market.

(6) It is also believed that the partial substitution of Cs$^+$, MA$^+$, Br$^-$ can flexibly adjust the band gap of FAPbIs perovskite, stabilize the perovskite lattice, and improve the stability of the device.

Another embodiment of this application relates to a method for preparing the above-mentioned perovskite composition, in particular to a method for preparing the perovskite precursor solution, which includes the following steps:

mixing CsI, FAI, MABr, PbI$_2$ and PbBr$_2$ in DMF:DMSO mixed solvent with a chemical formula of $Cs_x(FA_yMA_{1-y})_{1-x}Pb(I_yBr_{1-y})_3$ (where x is about 0 to about 0.15, and y is about 0.85 to about 1), adding MACl and ODADI into the mixture; and stirring at room temperature for about 6 to about 10 hours.

FAPbI$_3$ perovskite is considered as an important solar cell material. Without intending to be bound by theory, it is believed that the solution stirring time during its preparation process can have an impact on its performance. In general, it is believed that longer solution stirring time can improve the crystal quality and optoelectronic properties of FAPbI$_3$ perovskite thin films, but it may also cause some problems.

Some previous studies have shown that stirring the solution of FAPbI$_3$ perovskite for a longer time can increase its crystal size and crystallinity, thereby improving its optoelectronic performance. This is because longer stirring can promote the dispersion and reaction of the precursors in the solution, and contribute to the growth and crystallization of crystals. However, if the stirring time is too long, problems such as uneven crystal growth and crystal defects may occur, thereby reducing the performance of the material.

Therefore, proper solution stirring time optimization is required to obtain the best performance of FAPbI$_3$ perovskite materials. The present invention surprisingly finds that a stirring time of about 6 to about 10 hours can avoid the above-mentioned disadvantages and provide the perovskite composition with desirable performances.

In certain embodiments, the perovskite precursor solution is prepared as follows. About 1.25 M to about 2.0 M perovskite precursor solution is prepared by mixing CsI, FAI, MABr, PbI$_2$ and PbBr$_2$ in DMF:DMSO (about 4:1/v:v to about 9:1/v:v) mixed solvent with a chemical formula of Cs$_x$(FA$_y$MA$_{1-y}$)$_{1-x}$Pb(I$_y$Br$_{1-y}$)$_3$ (where x is about 0 to about 0.15, and y is about 0.85 to about 1), Then about 8 mol % to about 37 mol % of MACl and about 0.2 mol % to about 1.4 mol % ODADI are added into the perovskite precursor. The solution is stirred at room temperature for about 6 hours to about 10 hours before use.

2. Interface Modification Layer

Among perovskite solar cells (PSCs), it is believed that inverted (p-n/p-i-n structure) devices have typically exhibited more stable behavior than conventional (n-p/n-i-p) PSCs, due in part to their non-doped hole transporting materials and highly crystalline perovskite films. The following description is with primary reference to inverted PSCs, but the beneficial effects of an interface modification layer as described herein apply equally to a conventional PSC structure.

In previous PSCs, the functional or active perovskite layer is usually sandwiched between a hole transport layer (HTL) and an electron transport layer (ETL). In other words, the charge transporting layers are deposited on the top and the bottom sides of the perovskite active layer, respectively. The charge carriers are extracted at the HTL/perovskite and perovskite/ETL interfaces and collected through the respective conductors/contacts. During this process, the carrier charges may be subject to recombination, for example due to any interfacial defects and associated specific charge distributions.

Interface recombination arises from charge dynamics at the interface (including charge extraction, charge transfer, and charge recombination). The imperfect interfacial structural and electronic mismatches usually act as energy barriers for charge transport and charge recombination. Furthermore, defects at the surface and interface of polycrystalline perovskite films are mostly either positively charged or negatively charged. Trap states at the perovskite surface and interfaces can lead to charge accumulation and recombination losses in the device.

An embodiment of the present invention relates to an interface modification layer that is in contact with the perovskite layer and comprises at least one ammonium acetate selected from the group consisting of Pentylammonium Acetate (PenAAC), Phenylethylammonium Acetate (PEAAc), 2-([1,1'-biphenyl]-4-yl) ethan-1-amine acetate (BEAAc), Butanammonium Acetate (BAAc), Hexylammonium Acetate (HAAc), Octylammonium Acetate (OAAc), Phenylbutanammonium Acetate (PhBAAc), and any combination thereof. The structures of these compounds are shown below:

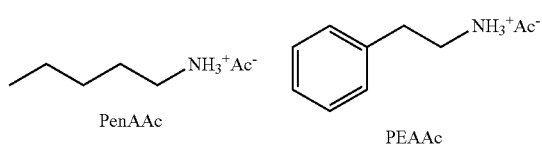

PenAAc

PEAAc

-continued

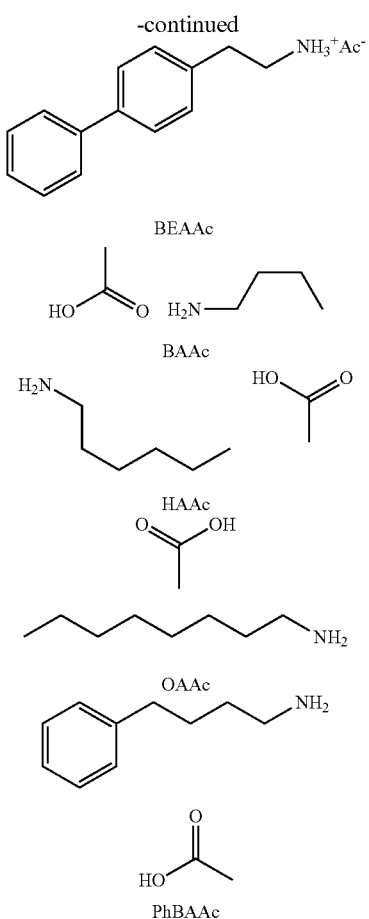

BEAAc

BAAc

HAAc

OAAc

PhBAAc

Without intending to be limited by theory, it is believed that the performance of a perovskite solar cell (such as those PSCs described herein) can be improved when an interface modification layer comprising an interfacial compound as described herein is in contact with the perovskite layer. It is believed that such a modification layer can suppress defects in the perovskite surface and minimize interfacial non-radiative combination losses. In this way, the interface modification layer may improve the extraction of electrons at the perovskite interface, increase the efficiency of the solar cell, and improve the stability of the solar cell.

In some embodiments, the interface modification layer is in contact with at least one surface of the perovskite layer. In some embodiments, the interface modification layer is provided at least on the side of the perovskite layer that is facing towards the substrate of the PSCs. In some embodiments, the interface modification layer can be provided on both sides of the perovskite layer. For example, when the interface modification layer is comprised in inverted PSCs (inverted flexible PSCs in particular), the interface modification layer can be positioned: (1) in contact with only the bottom surface of the perovskite layer (e.g., provided between the hole transport layer and the perovskite layer); or (2) in contact with both the bottom and the top surfaces of the perovskite layer (e.g., provided between the hole transport layer and the perovskite layer, and between the electron transport layer and the perovskite layer).

Without intending to be bound by theory, it is believed that bottom passivation (i.e., the interface modification is in contact with the bottom surface of the perovskite layer in an inverted p-i-n structure), on the one hand can passivate surface defects the perovskite surface, on the other hand can increase the bonding force between perovskite and substrate, which can be especially benefit for flexible perovskite solar cells since the bonding force between the perovskite and the substrate can be increased to provide the solar cells with good mechanical properties.

In some embodiment herein, the at least one ammonium acetate comprises pentylammonium acetate. Without intending to be bound by theory, it is believed that PenAAc, as a bottom interface modifier for a perovskite layer in inverted flexible PSCs can not only enhance the efficiency but also increase stability of flexible PSCs.

Another embodiment of the present invention relates to use of an ammonium acetate selected from the group consisting of pentylammonium acetate, phenylethylammonium acetate, 2-([1,1'-biphenyl]-4-yl) ethan-1-amine acetate, butanammonium acetate, hexylammonium acetate, octylammonium acetate, phenylbutanammonium acetate, and any combination thereof, to modify a perovskite layer in a perovskite solar cell.

In some embodiment, the perovskite solar cell is an inverted flexible perovskite solar cell.

3. Perovskite Solar Cell (PSC)

An embodiment of the present invention relates to perovskite solar cell including a perovskite layer and an interface modification layer as defined herein.

Persons skilled in the art would know that the benefits and advantages of the interface modification layer according to the invention, as explained above, will also reveal themselves in PSCs. In addition, without intending to be limited by theory, it is also believed that, by introducing the interface modification layer as defined herein (e.g., PenAAc) into the interface between perovskite and HTL, we can fabricate highly efficient and stable flexible inverted PSCs. DFT simulation reveals that the PenA+ and Ac$^-$ have strong chemical binding with both acceptor and donor defects of perovskite surface-terminating ends. The perovskite layer modified with the interface modification layer as defined herein may show reduced trap-state densities and suppressed nonradiative recombination loss. The resulting flexible PSCs can reach a record PCE of 23.68% (0.08 cm$^2$, certified: 23.35%), which is currently the highest value of the certified efficiency for flexible PSCs. Large-area devices (1.0 cm$^2$) also realize a high PCE of 21.52%. Moreover, the flexible PSCs fabricated according to this invention can show excellent stability under mechanical bending, with PCE remaining above about 91% of the original PCE even after about 5,000 bends. The inventors examine the long-term light stability of devices with and without PenAAc under continuous white light-emitting diode (LED) illumination with the intensity of 1-sun equivalent. After being illuminated for more than about 1,000 h, the efficiencies of a small area flexible PenAAc-modified device and control devices decreased to about 94.31% and about 88.09% of their initial values, respectively.

In some embodiments, the perovskite solar cell is an inverted flexible perovskite solar cell and further includes:
(a) a flexible substrate layer;
(b) a transparent electrode on the flexible substrate layer;
(c) a hole transport layer positioned between the transparent electrode and the interface modification layer;
(d) an electron transport layer on the perovskite layer;
(e) a metal electrode on the electron transport layer; and
(f) optionally a buffer layer positioned between the electron transport layer and the metal electrode.

With reference to FIG. 1, an 'inverted' perovskite photovoltaic cell comprising a p-n or p-i-n junction is described (where holes are collected at a transparent electrode). In the following discussion, like reference numerals refer to like features. As shown in FIG. 1, the photovoltaic cell includes from bottom to top the following layers: the flexible substrate 10, which may include PEN: the transparent electrode 20, which may include ITO; the hole transport layer 30, which may include PTAA: the bottom modification layer 40, which may include PenAAc: the perovskite layer 50, which may include a perovskite composition as described herein: the electron transport layer 60, which may include $C_{60}$: the optional buffer layer 70, which may include BCP; and the metal electrode 80, which may include Ag.

Substrate

In some embodiments, the perovskite solar cell includes a substrate which forms the base or support for the solar cell structure. Visible light (such as incident sunlight) enters the solar cell through the substrate.

In some embodiment, the substrate is transparent and may be formed of glass, or any other suitable transparent material. In an embodiment herein, the substrate is a flexible substrate selected from the group of PET, PEN, CPI, and a combination thereof. In some embodiments, the substrate is selected from PET and PEN. Without intending to be bound by theory, it is believed that using PET or PEN as substrate material may have one or more of the following benefits.

Advantages of using PET substrate include but are not limited to:
(1) Low cost: PET is believed to be a polymer-based material with low cost.
(2) Excellent flexibility: PET is believed to have good flexibility and plasticity, and can be bent, curled and stretched, so it is very suitable for highly flexible solar cell applications.
(3) Good transparency: PET is believed to have good transparency and optical transmittance, which can improve the light absorption efficiency of solar cells.

Advantages of PEN substrate include but are not limited to:
(1) High-temperature stability: PEN is a high-temperature-resistant polymer-based material that can withstand temperatures up to about 200° C., so it may be very suitable for use in high-temperature environments.
(2) Excellent mechanical properties: PEN is believed to have good mechanical properties and stability, and can withstand greater pressure and stretching, so it may be very suitable for use in complex environments.
(3) Lower surface roughness: The surface of PEN may be smoother than that of PET, which can improve the photoelectric conversion efficiency of solar cells.

Transparent Electrode

In some embodiments, the perovskite solar cell includes a transparent electrode, which may include a material selected from the group consisting of ITO, FTO, Ag nanowires, and a combination thereof. In some embodiments, the transparent electrode may include ITO, or Ag nanowires. Without intending to be bound by theory, it is believed that the advantages of using ITO include one or more of:
(1) High transparency: ITO is believed to have high transparency, which allows light to pass through the electrode and improves the light absorption efficiency of the solar cell device.
(2) Excellent electrical conductivity: ITO is believed to have excellent electrical conductivity and can be used as an efficient electron transport channel to improve the electrical performance of the solar cell device.

(3) Good chemical stability: ITO is believed to have good chemical stability, can be used in different environments, and has a long service life.

In some embodiments, the substrate/transparent electrode can be selected from the group of ITO/Glass, ITO/PEN, ITO/PET, FTO/Glass, FTO/PEN, FTO/PET, and a combination thereof. In some embodiments, the solar cell device may include PET/ITO and PEN/ITO. The advantages of using PET, PEN and ITO are described above.

Perovskite Layer

In some embodiments, the perovskite solar cell includes a perovskite layer, which is the active or functional layer of the solar cell. In other words, the perovskite layer is the light-absorbing layer of the solar cell. The term 'light-absorbing' in relation to the perovskite(s) (and by extension the perovskite layer comprising one or more perovskites) refers to its role in absorbing light, e.g. visible light, so as to act as a light absorbing material which allows to convert the light into electrical energy. A perovskite type compound exhibits strong absorption with respect to visible light incident on the solar cell, and the bandgap of a perovskite semiconductor can be tuned to a desired band gap energy ($E_G$), thereby improving the efficiency of such solar cells.

As in the exemplar solar cell depicted in FIG. 1, solar radiation or visible light passes through the substrate layer 10/20 into the active layer 50 (i.e., the perovskite layer), whereupon at least a portion of the solar radiation is absorbed by exciting an electron across a semiconductor band gap so as to enable electrical generation. In particular, the electron is excited from a valence band of the semiconductor, across the bandgap, to a conduction band. The excited electron sits in the conduction band, and a corresponding hole (a vacancy or absence of an electron, rather than a physical particle in and of itself) remains in the valence band of the semiconductor.

In some embodiments, the perovskite layer can include one or more heterojunctions. Heterojunctions can be formed within the perovskite layer by way of two different, undoped, perovskite materials. Thus, the perovskites referred to herein may both be undoped semiconductors. Alternatively, the perovskite may be doped with p-type or n-type dopants to form a junction. In other words, they may be doped (throughout and/or at the surface) with at least one dopant material of greater valence than the bulk material (to provide n-type doping) and/or may be doped with at least one dopant material of lower valence than the bulk material (to give p-type doping). N-type doping will tend to increase the n-type character of the semiconductor material, while p-type doping will tend to reduce the degree of the natural n-type state (e.g. due to defects). Such doping may be made with any suitable material including F, Sb, N, Ge, Si, C, In, InO and/or Al. Suitable dopants and doping levels will be evident to those of skill in the art.

In some embodiments, the light-absorbing perovskite layer may comprise one or more metal halide perovskites. In some examples, the light-absorbing perovskite layer may comprise two different metal halide perovskites configured to form a semiconductor heterojunction within the perovskite layer. Any perovskite capable of performing the desired light-absorbing and charge separation functions may be used in the light-absorbing perovskite layer.

In some embodiments, the the perovskite layer may comprise the perovskite composition having the empirical formula $Cs_y(FA_yMA_{1-y})_{1-x}Pb(I_yBr_{1-y})_3$, as defined above. Without intending to be bound by theory, it is believed that with FAPbIs as the main body, part of $FA^+$ can be replaced by $Cs^+$ or $MA^+$ ions, and part of $I^-$ can be replaced by $Br^-$, such $FAPbI_3$ perovskite according to this invention may have one or more advantages, as described above.

Hole Transport Layer (HTL)

In some embodiment, the PSC may further includes a hole transport layer, HTL, comprising or consisting of one or more hole transport materials. In an inverted PSC, for example, as shown in FIG. 1, the HTL (the hole transport layer 30) is located proximate to the transparent substrate 10 (holes are collected at the electrode proximate the substrate, converse to the conventional PSC).

Any hole-transport material known to the skilled person may be used. Example hole transport materials include but is not limited to organic hole-transport materials, inorganic hole-transport materials, or combinations thereof. Organic hole-transport materials may be polymeric or non-polymeric. Exemplary polymeric hole-transport materials include polythiophenes, for example poly(3-hexylthiophene) (P3HT): poly(arylamines) for example PTTA; and doped PEDOT, for example Poly(3,4-ethylenedioxy thiophene):polystyrene sulfonate (PEDOT:PSS). Exemplary non-polymeric organic hole-transport materials are compounds containing one or more arylamine groups, for example spiro-OMeTAD. Examplary inorganic hole-transport materials include copper-based materials (e.g. $CuO_x$, CuSCN, CuI, etc.), nickel-based materials (e.g. $NiO_x$), two-dimensional layered materials such as chalcogens (e.g. $MoS_2$, $WS_2$, etc.). $CuO_x$ is usually used to denote copper oxide compounds with indeterminate oxygen content, where x can be any value, usually 1 or 1.5. $CuO_1$ represents cupric oxide, and $CuO_{1.5}$ represents cuprous oxide. $NiO_x$ is usually used to denote nickel oxide compounds with indeterminate oxygen content, where x can be any value. Hole transport materials encourage a flow of holes from the p-type perovskite, away from the junction within layer, while blocking the movement of electrons.

In some embodiments, the hole transport layer includes a material selected from the group of PEDOT:PSS, PTAA, and a combination thereof. In some embodiments, the HTL may include PTAA. Without intending to be bound by theory, it is believed that using PTAA as an HTL may have at least one or more advantages as follows:

(1) High hole mobility: PTAA is believed to have high hole mobility, which allows it to efficiently transport holes from the active layer to the electrode, leading to improved device performance.

(2) Good film-forming properties: PTAA can form a smooth and uniform film on the active layer, which helps to reduce the likelihood of defects and improve the device stability.

(3) Excellent thermal stability: PTAA is believed to be thermally stable and can withstand high temperatures, which is important for the stability and durability of the solar cell.

(4) Low cost: PTAA is relatively low cost compared to other commonly used HTLs such as PEDOT: PSS, which can make it an attractive option for mass production of solar cells.

Electron Transport Layer (ETL)

In some embodiments, the solar cell may further includes an electron transport layer (ETL) 60. The ETL comprises an electron transport material. Any electron transport material known to the skilled person may be used. The ETL may comprise or consist of an organic electron transport material, an inorganic electron transport material or mixtures thereof. Example electron transport materials include organic materials such as fullerenes, for example $C_{60}$ or PCBM (e.g., [6,6]-Phenyl-$C_{61}$-butyric acid methyl ester ($PC_{61}BM$),

[6,6]-Phenyl-$C_{72}$-butyric acid methyl ester ($PC_{72}BM$)), metal oxides such as $TiO_2$, ZnO, $SnO_2$. Electron transport materials may encourage a flow of electrons from the n-type perovskite, away from the junction within the perovskite layer 50, while blocking the movement of holes. In this way, electrons accumulate at electron transport layer 60. In use, the electron transport layer 60 is negatively charged due to the accumulation of electrons. When the solar cell is connected to an external load, the electrons leave the solar cell via the electron transport layer 60.

In some embodiments, the electron transport layer may include a material selected from the group of $C_{60}$, $TiO_2$, $SnO_2$, $PC_{61}BM$, $PC_{72}BM$, and a combination thereof. In some embodiments, the ETL may include $C_{60}$. Without intending to be bound by theory, it is believed that the advantages of using $C_{60}$ as an ETM include one or more of:
(1) High electron mobility: $C_{60}$ is believed to have high electron mobility, allowing it to efficiently transport electrons from the active layer to the electrode, leading to improved device performance.
(2) Good energy level alignment: $C_{60}$ is believed to have a low-lying lowest unoccupied molecular orbital (LUMO) energy level, which matches well with the energy levels of many common donor materials, allowing for efficient electron transfer at the donor/acceptor interface.
(3) Good film-forming properties: $C_{60}$ can form a uniform and smooth film on the active layer, which helps to reduce the likelihood of defects and improve the device stability.

In some embodiments, the electron transport materials in organic and perovskite solar cells may include PCBM (phenyl-$C_{61}$-butyric acid methyl ester), or PCBM derivatives.

Buffer Layer

In a structure including a $C_{60}$ layer/a BCP layer/a metal counter electrode layer (e.g., Ag), the BCP is the buffer layer, which may impart one or more of the following benefits:
(1) Facilitating the formation of a better interface: it is believed that the BCP layer can help to form a better interface between $C_{60}$ and the metal counter electrode layer such as Ag, thereby improving the electron transport performance. Without intending to be bound by theory, it is believed that this is because BCP molecules have the ability to form an ordered adsorption structure on the surfaces of $C_{60}$ and Ag, which promotes the close coupling between $C_{60}$ and Ag.
(2) Improving electron transport efficiency: it is believed that the BCP layer can effectively improve the electron transport efficiency and reduce electron-hole recombination losses. Without intending to be bound by theory, it is believed that this is because the BCP layer has good electron transport properties, which can help to transport electrons quickly, while also preventing recombination between electrons and holes.
(3) Enhancing stability: it is believed that the BCP layer can enhance the stability of perovskite solar cells. Without intending to be bound by theory, it is believed that this is because BCP molecules have strong aromaticity and π-π stacking interactions, which can improve the chemical and photo-stability of perovskite solar cells.

In some embodiments, the PSC structure of the present application comprises: a conductive PEN/ITO substrate/a PTAA layer/a PenAAc layer/a perovskite layer/a $C_{60}$ layer/a BCP layer/a metal counter electrode layer. In some embodiments, the perovskite solar cell may have a structure of polyethylene naphthalenediate/indium tin oxide/poly(triaryl amine)/pentylammonium acetate/perovskite/$C_{60}$/2,9-dimethyl-4,7-diphenyl-1,10 phenanthroline/silver in sequence. In some embodiments, the metal electrode layer in the PSC of the present application may include gold, silver, copper, or any combinations thereof.

Specifically, in the above structure, PEN/ITO is used as a substrate combined with a transparent electrode layer (also referred to as PEN/ITO substrate) for the device: Poly(bis (4-phenyl) (2,4,6-trimethylphenyl)amine) (PTAA) and $C_{60}$ are used as the hole transport layer (HTL) and electron transport layer (ETL): perovskite is used as the light absorption layer; PenAAc is used as the interlayer between the perovskite and PTAA: 2,9-dimethyl-4,7-diphenyl-1,10 phenanthroline (BCP) is used as the buffer layer: silver is used as the metal counter electrode layer.

4. Preparation of Perovskite Solar Cell (PSC)

Another embodiment of the present application relates to a process of preparing an inverted perovskite solar cell, which includes the steps of;
providing a substrate layer;
providing a transparent electrode on the flexible substrate layer;
coating a hole transport layer onto the substrate layer;
coating a perovskite layer;
coating an electron transport layer onto the perovskite layer;
coating a metal electrode on the electron transport layer;
in which, an interface modification layer is coated onto the hole transport layer prior to coating the perovskite layer, and/or coating onto the perovskite layer followed by coating the perovskite layer; and
in which the interface modification layer comprises at least one ammonium acetate selected from the group of pentylammonium acetate, phenylethylammonium acetate, 2-([1,1'-biphenyl]-4-yl) ethan-1-amine acetate, butanammonium acetate, hexylammonium acetate, octylammonium acetate, phenylbutanammonium acetate, and any combination thereof.

Without intending to be bound by theory, it is believed that the method according to this invention can provide solar cell devices having high efficiency and good stability, as described above for the PSCs.

In some embodiments, the step of coating the hole transport layer may include:
spin-coating a solution comprising about 2 mg/mL hole transport material onto the substrate at a speed of about 3,500 to about 5,000 rpm for about 20 to about 60 seconds (e.g., about 30 seconds) and
subsequently annealing at a temperature of about 90° C. to about 110° C. (e.g., about 100° C.) for about 10 to about 15 min (e.g., about 10 min).

Without intending to be limited by theory, it is believed that spin coating at a speed of about 3,500 to about 5,000 rpm for about 20 to about 60 seconds can help to ensure a uniform and consistent coating thickness and improve the film quality. It is also believed that annealing the coated layer at a temperature of about 90 to about 110° C. for about 10 to about 15 minutes can help to improve the film morphology, increase the crystallinity of the hole transport material, and enhance the charge carrier transport properties.

In some embodiments, the step of coating the perovskite layer may include:
preparing a perovskite precursor solution by mixing CsI, FAI, MABr, $PbI_2$ and $PbBr_2$ in DMF:DMSO (from about 4:1/v:v to about 9:1/v:v) mixed solvent with a perovskite composition having the empirical formula $Cs_x(FA_yMA_{1-y})_{1-x}Pb(I_yBr_{1-y})_3$, and adding about 8 mol % to about 37 mol % (e.g., about 10 mol %) of MACl and about 0.2 mol % to about 1.4 mol % (e.g., about 0.6 mol %) of ODADI into the solution;

dropping the perovskite precursor solution on the hole transport layer and spin-coated at a speed of about 350 to about 1,800 rpm (e.g., about 1,000 rpm) for about 5 to about 20 seconds (e.g., about 10 seconds), and subsequently at about 3,500 to about 7,000 rpm (e.g., about 5,000 rpm) for about 30 to about 60 seconds (e.g., about 45 seconds); during the second step, 180 µl CB as anti-solvent is quickly dripped onto the center of perovskite film about 5 to about 20 seconds (e.g., about 12 seconds) before the end of spin-coating process and annealing at a temperature from about 90° C. to about 160° C. (e.g., about 100° C.) for about 7 min to about 50 min (e.g., about 30 min).

Without intending to be bound by theory, it is believed that the dropping of the precursor solution onto the hole transport layer and initial spin-coating at a low speed of about 350 to about 1,800 rpm for about 5 to about 20 seconds can help to ensure a uniform and consistent coating thickness and improve the surface morphology. It is also believed that, spin-coating at a high speed of about 3,500 to about 7,000 rpm for about 30 to about 60 seconds can help to further improve the film quality and remove any residual solvent or impurities. In addition, annealing the coated perovskite layer at a temperature from about 90 to about 160° C. for about 7 to about 50 minutes can help to improve the crystal structure and morphology of the perovskite film, leading to improved device performance.

In some embodiments, the interface modification layer is prepared by spinning a solution comprising at least one ammonium acetate in a concentration of about 0.4 to about 2.5 mg/mL, in particular about 1.2 mg/mL, onto the hole transport layer or the perovskite layer.

Without intending to be bound by theory, it is believed that concentrations of surface passivation materials that are too high or too low can negatively impact device performance. If the concentration of surface passivation material is too high, it may cause the material to form a thick layer on the surface, which hinders electron transport, thereby reducing the electron transport efficiency of the device. In addition, too high a concentration may also cause materials to aggregate together, form particles, and be difficult to distribute evenly on the device surface, resulting in uneven device surfaces and reduced electrical performance. Conversely, if the concentration of surface passivation materials is too low; the surface may not be effectively passivated, resulting in surface defects and non-radiative recombination events, thereby reducing device performance and stability. The concentration of about 1.2 mg/mL is a specific value that has been optimized for the specific device architecture and material system used in the described embodiment.

In some embodiments, the solution comprising at least one ammonium acetate is spin-coated at a speed of about 4,000 to about 5,000 rpm for about 30 seconds.

In some embodiments, the spin-coated solution is subsequently annealed at a temperature of about 90° C. to about 110° C. for about 10 min to about 15 min.

In some embodiments, the PSC is fabricated method is as follows. PEN/ITO substrate (about 10 to about 45 (2 sq$^{-1}$) are sequentially cleaned by sonication with detergent, deionized water, acetone and isopropyl alcohol for about 10 to about 30 min, respectively. Then, the PEN/ITO substrate are dried at about 80 to about 120° C. in oven, and then are treated with oxygen plasma for about 5 to about 20 min and finally transferred into a N$_2$-filled glovebox before use.

Then, about 2 mg mL$^{-1}$ PTAA in CB is spin-coated onto the substrate at about 3,500 to about 5,000 rpm for about 20 s to about 60 s and are subsequently annealed at about 90 to about 110° C. for about 10 to about 15 min. After cooling for about 5 to about 10 min, the passivation layer (or the interface modification layer), PenAAc (about 0.4 to about 2.5 mg mL$^{-1}$ in IPA) is spun onto the PTAA layer with a speed of about 4,000 to about 5,000 rpm for about 30 s and annealed at about 90 to about 110° C. for about 5 to about 10 min. After cooling, the mixed-cation perovskite film is then deposited on PTAA by one-step spin-coating method. About 1.25 to about 2.0 M perovskite precursor solution is prepared by mixing CsI, FAI, MABr, PbI$_2$ and PbBr$_2$ in DMF:DMSO (about 4:1/v:v to about 9:1/v:v) mixed solvent with a chemical formula of Cs$_x$(FA$_y$MA$_{1-y}$)$_{1-x}$Pb(I$_y$Br$_{1-y}$)$_3$ (where x=0~0.15, and y=0.85~1). Then about 8 to about 37 mol % of MACl and about 0.2 to about 1.4 mol % ODADI are added into the perovskite precursor. About 40 to about 80 µL perovskite precursor solution is dropped on PTAA and spin-coated at about 350 to about 1,800 rpm for about 5 to about 20 s, subsequently at about 3,500 to about 7,000 rpm for about 30 to about 60 s. About 150 to about 300 µL anti-solvent chlorobenzene is slowly dripped onto the center of film at about 5 to about 18 s before the end of spin-coating. The as-prepared perovskite films are subsequently annealed on a hotplate at about 90 to about 160° C. for about 7 to about 50 min. The spin-coating processes were all conducted at room temperature (about 20° C. to about 25° C.) in a N$_2$-filled glovebox with the contents of O$_2$ and H$_2$O<2 ppm. Finally, about 10 nm to about 30 nm C$_{60}$ with an evaporating rate of about 0.3 Å s$^{-1}$~ about 1.5 Å s$^{-1}$, about 4 to about 10 nm BCP at a rate of about 0.2 Å s$^{-1}$~ about 1.2 Å s$^{-1}$ and about 70 to about 120 nm silver electrode at a rate of about 0.5 to about 3.0 Å s$^{-1}$ are thermally evaporated, respectively, under high vacuum (< about 4×10$^{-6}$ Torr).

Many different aspects and embodiments are possible. Some of those aspects and embodiments are described below. After reading this specification, skilled ones will appreciate that those aspects and embodiments are only illustrative and do not limit the scope of the present invention. Embodiments may be in accordance with any one or more of the embodiments as listed below.

Embodiment 1: Use of an ammonium acetate selected from the group of pentylammonium acetate, phenylethylammonium acetate, 2-([1,1'-biphenyl]-4-yl) ethan-1-amine acetate, butanammonium acetate, hexylammonium acetate, octylammonium acetate, phenylbutanammonium acetate, and any combination thereof, to modify a perovskite layer in a perovskite solar cell.

Embodiment 2: The use of embodiment 1, wherein the at least one ammonium acetate comprises pentylammonium acetate having a structure of

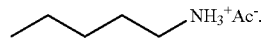

Embodiment 3: The use of any of the preceding embodiments, wherein the perovskite solar cell is an inverted flexible perovskite solar cell.

Embodiment 4: The use of any of the preceding embodiments, wherein the ammonium acetate is in contact with one side or both sides of the perovskite layer in the perovskite solar cell.

Embodiment 5: The use of any of the preceding embodiments, wherein the ammonium acetate is used to modify only the bottom surface of the perovskite layer in an inverted flexible perovskite solar cell, or both the top surface and the bottom surface of the perovskite layer in an inverted flexible perovskite solar cell.

Embodiment 6: A perovskite solar cell comprising
a perovskite layer; and
an interface modification layer that is in contact with the perovskite layer and includes at least one ammonium acetate selected from the group of pentylammonium acetate, phenylethylammonium acetate, 2-([1,1'-biphenyl]-4-yl) ethan-1-amine acetate, butanammonium acetate, hexylammonium acetate, octylammonium acetate, phenylbutanammonium acetate, and any combination thereof.

Embodiment 7: The perovskite solar cell of embodiment 6, wherein the at least one ammonium acetate includes pentylammonium acetate.

Embodiment 8: The perovskite solar cell of any of embodiments 6-7, further including a perovskite layer comprising a perovskite composition having the empirical formula:

wherein x is from about 0 to about 0.15;
wherein y is from about 0.85 to about 1;
wherein FA is formamidinium; and
wherein MA is methylamine.

Embodiment 9: The perovskite solar cell of any of embodiments 6-8, wherein the perovskite solar cell is an inverted flexible perovskite solar cell including:
(a) a flexible substrate layer;
(b) a transparent electrode on the flexible substrate layer;
(c) a hole transport layer positioned between the transparent electrode and the interface modification layer;
(d) an electron transport layer on the perovskite layer;
(e) a metal electrode on the electron transport layer; and
(f) optionally a buffer layer positioned between the electron transport layer and the metal electrode.

Embodiment 10: The perovskite solar cell of any of embodiments 6-9, wherein the flexible substrate layer includes a material selected from the group of PET, PEN, CPI, and a combination thereof.

Embodiment 11: The perovskite solar cell of any of embodiments 6-10, wherein the transparent electrode includes a material selected from the group of ITO, FTO, Ag nanowires, and a combination thereof.

Embodiment 12: The perovskite solar cell of any of embodiments 6-11, wherein the hole transport layer includes a material selected from the group of PEDOT:PSS, PTAA, and a combination thereof.

Embodiment 13: The perovskite solar cell of any of embodiments 6-12, wherein the electron transport layer includes a material selected from the group of $C_{60}$, $TiO_2$, $SnO_2$, $PC_{61}BM$, $PC_{72}BM$, and a combination thereof.

Embodiment 14: The perovskite solar cell of any of embodiments 6-13, which has a structure of polyethylene naphthalenediate/indium tin oxide/poly(triaryl amine)/pentylammonium acetate/perovskite/$C_{60}$/2,9-dimethyl-4,7-diphenyl-1,10 phenanthroline/silver in sequence.

Embodiment 15: A method of preparing an inverted perovskite solar cell including the steps of:
providing a substrate layer;
providing a transparent electrode on the flexible substrate layer;
coating a hole transport layer onto the substrate layer;
coating a perovskite layer;
coating an electron transport layer onto the perovskite layer;
coating a metal electrode on the electron transport layer;

wherein, an interface modification layer is coated onto the hole transport layer prior to coating the perovskite layer, and/or coating onto the perovskite layer followed by coating the perovskite layer; and
wherein the interface modification layer comprises at least one ammonium acetate selected from the group of pentylammonium acetate, phenylethylammonium acetate, 2-([1,1'-biphenyl]-4-yl) ethan-1-amine acetate, butanammonium acetate, hexylammonium acetate, octylammonium acetate, phenylbutanammonium acetate, and any combination thereof.

Embodiment 16: The method of embodiment 15, wherein the perovskite layer includes a perovskite composition having the empirical formula:

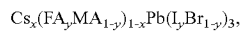

wherein x is from about 0 to about 0.15;
wherein y is from about 0.85 to about 1;
wherein FA is formamidinium; and
wherein MA is methylamine.

Embodiment 17: The method of any of embodiments 15-16, wherein the flexible substrate layer includes a material selected from the group of PET, PEN, CPI, and a combination thereof; the transparent electrode includes a material selected from the group of ITO, FTO, Ag nanowires, and a combination thereof; the hole transport layer includes a material selected from the group of PEDOT:PSS, PTAA, and a combination thereof; and the electron transport layer includes a material selected from the group of $C_{60}$, $TiO_2$, $SnO_2$, $PC_{61}BM$, $PC_{72}BM$, and a combination thereof.

Embodiment 18: The method of any of embodiments 15-17, wherein the step of coating the hole transport layer includes:
spin-coating a solution comprising about 0.5 to about 4 mg/mL (e.g., 2 mg/mL) hole transport material onto the substrate at a speed of about 3,500 to about 5,000 rpm (e.g., 4,000 rpm) for about 20 to about 60 seconds (e.g., 50 s) and
subsequently annealing at a temperature of about 90° C. to about 110° C. for about 10 to about 15 min.

Embodiment 19: The method of any of embodiments 15-18, wherein the step of coating the perovskite layer includes:
preparing a perovskite precursor solution by mixing CsI, FAI, MABr, $PbI_2$ and $PbBr_2$ in DMF:DMSO (from about 4:1/v:v to about 9:1/v:v) mixed solvent with a perovskite composition having the empirical formula $Cs_x(FA_yMA_{1-y})_{1-x}Pb(I_yBr_{1-y})_3$, and adding about 8 mol % to about 37 mol % of MACl and about 0.2 mol % to about 1.4 mol % of ODADI into the solution;
dropping the perovskite precursor solution on the hole transport layer and spin-coated at a speed of about 350 to about 1,800 rpm for about 5 to about 20 seconds, and subsequently at about 3,500 to about 7,000 rpm for about 30 to about 60 seconds; and
annealing at a temperature from about 90° C. to about 160° C. for about 7 min to about 50 min.

Embodiment 20: The method of any of embodiments 15-19, wherein the interface modification layer is prepared by spinning a solution comprising at least one ammonium acetate in a concentration of about 0.4 to about 2.5 mg/mL (e.g. 1.2 mg/mL) onto the hole transport layer or the perovskite layer.

Embodiment 21: The method of any of embodiments 15-20, wherein the solution including at least one ammonium acetate is spin-coated at a speed of about 4,000 to about 5,000 rpm for about 30 seconds.

Embodiment 22: The method of any of embodiments 15-21, wherein the spin-coated solution is subsequently annealed at a temperature of about 90° C. to about 110° C. for about 10 min to about 15 min.

EXAMPLES

Materials

Cesium iodide (CsI), formamidinium iodide (FAI), methylammonium bromide (MABr) are purchased from Dysol (Surface Prep Australia Pty Ltd, New South Wales, Australia). Lead iodide ($PbI_2$) and lead bromide ($PbBr_2$) are purchased from TCI (Tokyo Chemical Industry Co., Ltd. (Tokyo, JP)). Poly(bis(4-phenyl) (2,4,6-trimethylphenyl) amine) (PTAA), methylammonium chloride (MACl), 1,8-Octanediammonium iodide (ODADI), Pentylammonium Acetate (PenAAc), and bathocuproine (BCP, purity of 99.9%) are purchased from Xi'an Polymer Light Technology Corporation (Xi'an, China). The solvents, including N,N-dimethylformamide (DMF), dimethyl sulfoxide (DMSO), isopropanol (IPA) and chlorobenzene (CB) are purchased from J&K (J&K Scientific Ltd., Beijing, China) and used as received. Silver is purchased from commercial sources with high purity. All these materials in experiments are used as received without any further purification.

Device Fabrication

PEN/ITO or Glass/ITO substrates (15Ω $sq^{-1}$) are sequentially cleaned by sonication with detergent, deionized water, acetone and isopropyl alcohol for 20 min, respectively. Then, the PEN/ITO or glass/ITO substrates are dried at 80° C. in oven, and then are treated with oxygen plasma for 15 min and finally transferred into a $N_2$-filled glovebox before use.

Then, 2 mg $mL^{-1}$ PTAA in CB is spin-coated onto the substrate at 5,000 rpm for 30 s and are subsequently annealed at 100° C. for 10 min.

After cooling for 5 min, the interface modification layer, i.e., PEAAc (1.5 mg $mL^{-1}$ in IPA), BEAAc (1.0 mg $mL^{-1}$ in IPA) or PenAAc (1.2 mg $mL^{-1}$ in IPA) is spun onto the PTAA layer with a speed of 5,000 rpm for 30 s and annealed at 100° C. for 5 min. Control devices are the devices without intermediate modification on the perovskite film. Consequently, this step of coating the interface modification layer is omitted for control devices used herein.

After cooling, the mixed-cation perovskite film is then deposited on the interface layer (test group) or the PTAA layer (the control group) by one-step spin-coating method. The 1.7 M perovskite precursor solution is prepared by mixing CsI, FAI, MABr, $PbI_2$ and $PbBr_2$ in DMF:DMSO (4:1/v:v) with a chemical formula of $Cs_{0.05}(FA_{0.98}MA_{0.02})_{0.95}Pb(I_{0.98}Br_{0.02})_3$. The 10 mol % of MACl and 0.6 mol % ODADI are added into the perovskite precursor. 60 μL perovskite precursor solution is dropped on the interface layer or the PTAA and spin-coated at 1,000 rpm for 10 s and 5,000 rpm for 45 s. During the second step, 180 μl CB as anti-solvent is quickly dripped onto the center of perovskite film 12 s before the end of spin-coating process and then annealed at 100° C. for 30 min. The spin-coating processes are all conducted at room temperature.

Finally, 25 nm $C_{60}$, 6 nm BCP and 100 nm silver electrode are thermally evaporated, respectively, under high vacuum (<5×$10^{-6}$ Torr). The device area is defined and characterized as 0.08 $cm^2$ and 1.0 $cm^2$ by metal shadow mask, respectively. The PDMS and curing agent are mixed in a ratio of 10:1. The solution is repeatedly placed under vacuum in a vacuum drying oven several times so as to eliminate bubbles in the PDMS solution. Then the PDMS solution is dropped onto a silver electrode and spin-coated at 1,500 rpm for 20 s. Subsequently, the devices are placed in an $N_2$-glovebox for 24 h for sealing.

Device Characterization

The materials and device performance were characterized according to the following methods.

The UV-vis. absorptions are measured by a UV-vis. spectrometer (PerkinElmermodel Lambda 2S, https://www.perkinelmer.com.cn/contactus #/default, Shanghai, China). The test range is 550 to 900 nm, and the test step is 1 nm.

The surface-view morphologies are characterized by SEM (QUATTROS, Thermal Fisher Scientific, https://www.ietltd.com/Contact-Us, Illinois, USA). The accelerating voltage is 10 kV, and the working distance is 7.4 mm.

The XPS spectra is characterized by AXIS Supra XPS system (Kratos Analytical Ltd., https://lightmachinery.com/, Manchester, UK). The La line of La (487.5 eV), the vacuum degree is controlled below 10^-8 Pa, and the resolution is 0.1 ev.

Bruker Dimension Kelvin probe force microscopy in Potential Channel equipped with PFQNE-AL probe (https://www.brukerafmprobes.com/p-3817-pfqne-al.aspx, Camarillo, California, USA) is used to measure the surface potentials of perovskite films.

FLS980 (https://www.edinst.com/, Edinburgh Instruments Ltd. Scotland, UK) is used to obtain steady-state and time-resolved PL spectra with an excitation wavelength of 485 nm. The test step is 1 nm.

Space Charge Limited Current (SCLC) is performed on electron-only device and hole-only device, and measured from 0 to 6 V with a 0.02 V step size under dark conditions using a Keithley 2,400 source/meter unit.

Under simulated AM 1.5G in $N_2$ glovebox at room temperature, the J-V curves of perovskite devices are recorded using a Keithley 2,400 source meter (Keithley Instruments, Inc., https://www.tek.com/en/products/keithley, Cleveland, Ohio, USA), and the EQE spectra are carried out by a QE-R EQE system (EnLi Technology, https://enlitechnology.com/, Taiwan). The decay time is 10 ms and the test step is 0.02 V. The active area is defined as 0.105 $cm^2$ and the light intensity is calibrated using a standard KG2 Si diode (Kemet Corporation, https://www.kemet.com/en/us.html, Jacksonville, Florida, USA).

Example 1

Figure 2:
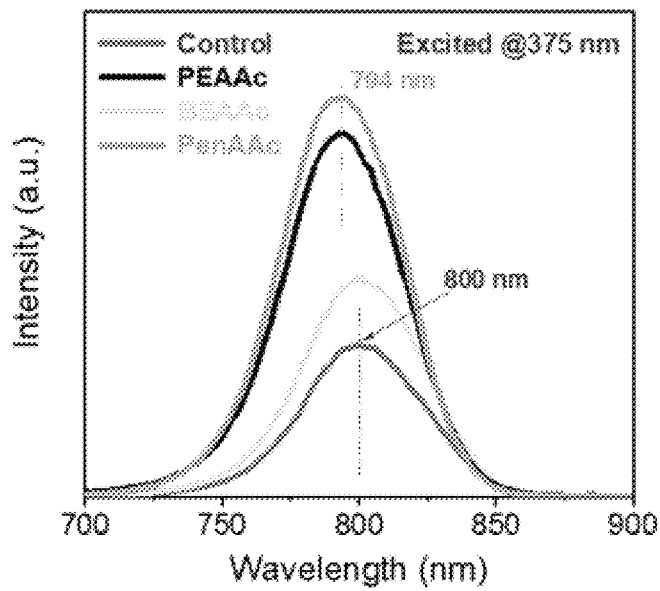
FIG. 2 shows PL spectra of control, PEAAc, BEAAc and PenAAc modified perovskite films.
Figure 3:
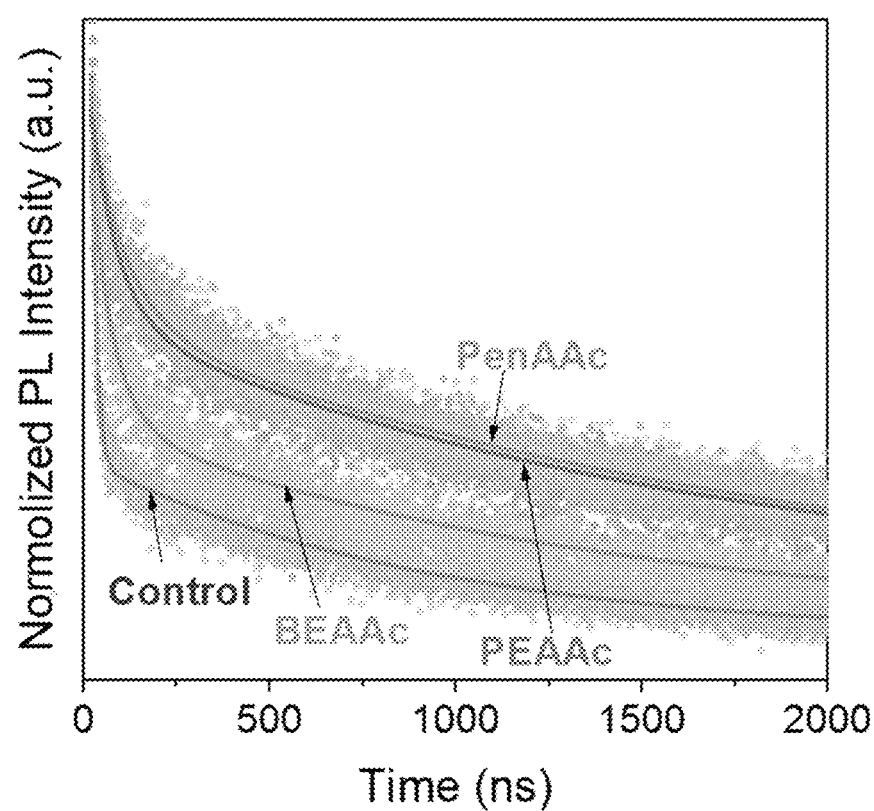
FIG. 3 shows TRPL spectra of control, PEAAc, BEAAc and PenAAc modified perovskite films.

Inverted flexible PSCs are processed in the sequence of Polyethylene naphthalenediate (PEN)/indium tin oxide (ITO)/poly(triaryl amine) (PTAA)/Pentylammonium Acetate (PenAAc)/perovskite/$C_{60}$/2,9-dimethyl-4,7-diphenyl-1,10 phenanthroline (BCP)/silver (Ag) (FIG. 1). A control device without PenAAc modification is also prepared. To verify the effect of PenAAc, we perform the carrier dynamic and defect state characterization on the perovskite films with three typical molecules with acetate anions, PEAAc, BEAAc and PenAAc. We first assess the charge carrier kinetics of the perovskite films using the steady-state Photoluminescence (PL) and Time-resolved Photoluminescence (TRPL). The PL intensity increases most noticeably with PenAAc-based films (FIG. 2), and the emission peak exhibits a blue shift (from 800 nm to 794 nm), implying that the non-radiative recombination may be suppressed by interfacial defect passivation. As shown in FIG. 3, the perovskite films with bottom interfacial passivation all exhibit increased carrier lifetime (PEAAc, τ=1558.43 ns; BEAAc, τ=1220.08 ns: PenAAc, τ=1730.98 ns) as compared to the control film (τ=787.64 ns). In particular, the PenAAc modified perovskite film demonstrates the longest carrier lifetime, suggesting that the synergistic modulation of PenA$^+$ and Ac$^-$ can achieve the best passivation effect.

Figure 4:
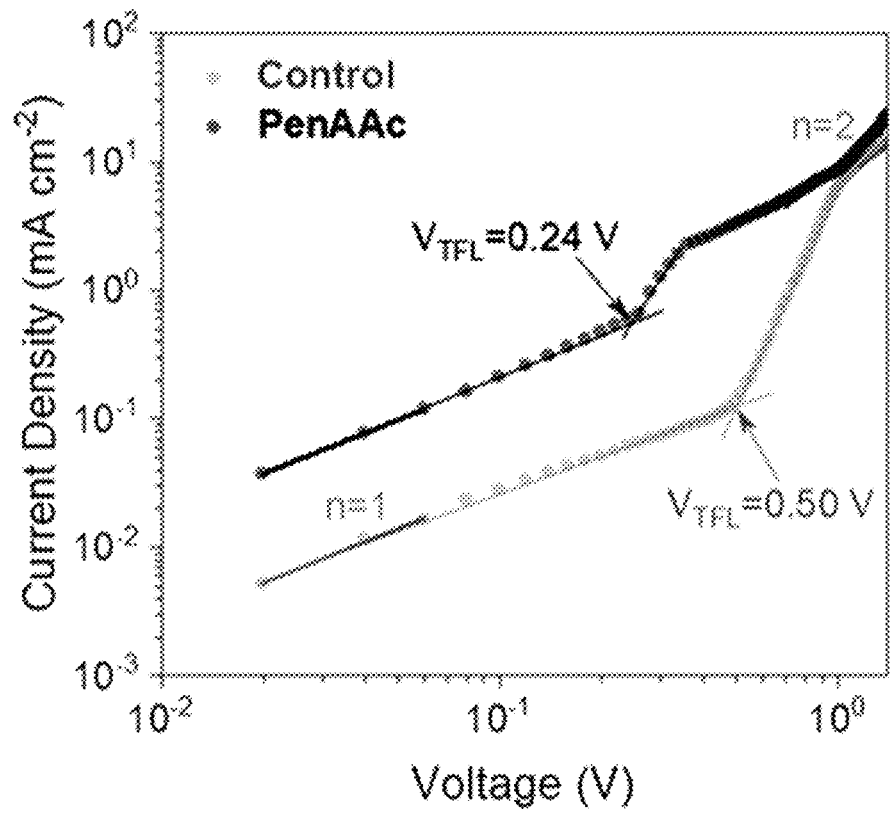
FIG. 4 shows SCLC plots of perovskite films with and without PenAAc based on a hole-only device.
Figure 5A:
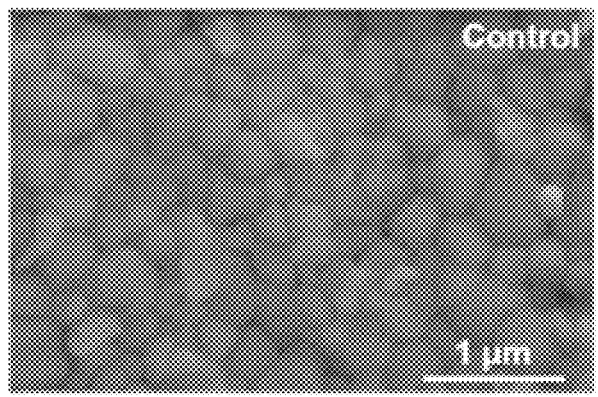
FIG. 5A shows a SEM image of perovskite films without interface modification.
Figure 5B:
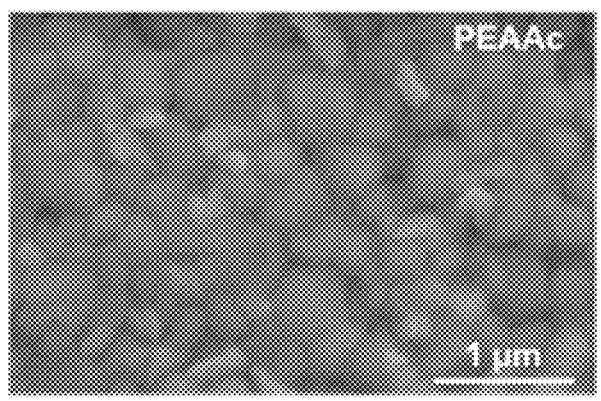
FIG. 5B shows a SEM image of PEAAc modified perovskite film.
Figure 5C:
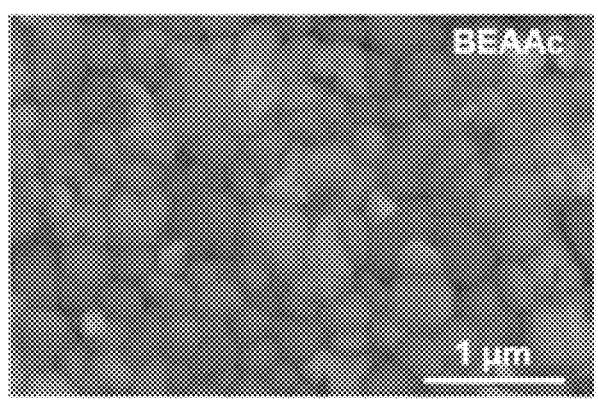
FIG. 5C shows a SEM image of BEAAc modified perovskite film.
Figure 5D:
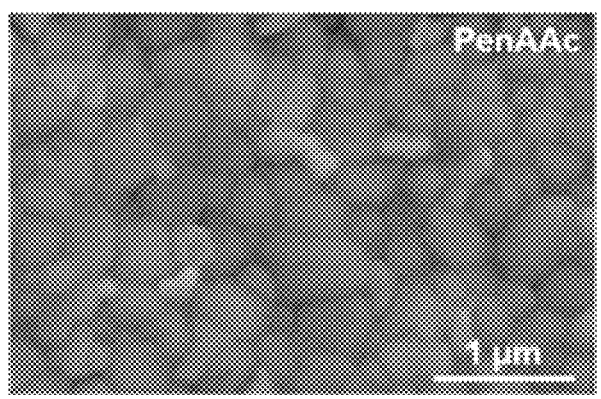
FIG. 5D shows a SEM image of PenAAc modified perovskite film.

To provide more insights about the effect of PenAAc on the trap-states at the bottom interface, we conducted the Space-Charge-Limited-Current (SCLC) measurements based on the hole-only device as shown in FIG. 4. The equation of $V_{TFL}=eNIL^2/2_{\varepsilon\varepsilon0}$ can be used to calculate the trap density (N), where L is the perovskite film thickness, $V_{TFL}$ is the trap-filling voltage, & is the relative dielectric constant, and co is the vacuum permittivity. After the PenAAc modification, the hole trap density decreases from $2.80\times10^{15}$ cm 3 to $1.35\times10^{15}$ cm$^{-3}$. The reduced hole defect density further confirms that the incorporation of PenAAc can efficiently passivate defects at the bottom interface, as well as prevent non-radiative recombination.

Figure 6:
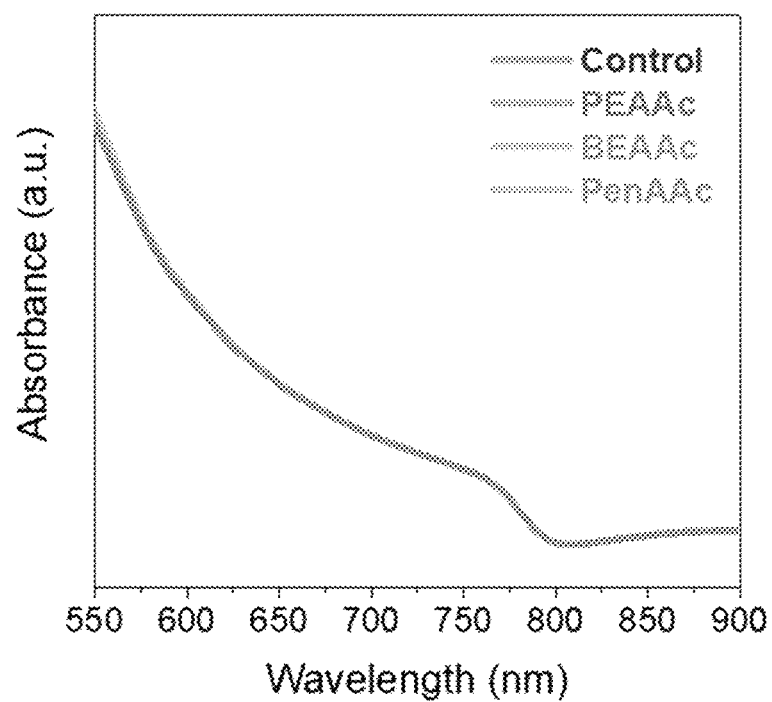
FIG. 6 shows UV-vis absorption spectra of control, PEAAc, BEAAc and PenAAc-modified perovskite films.
Figure 7:
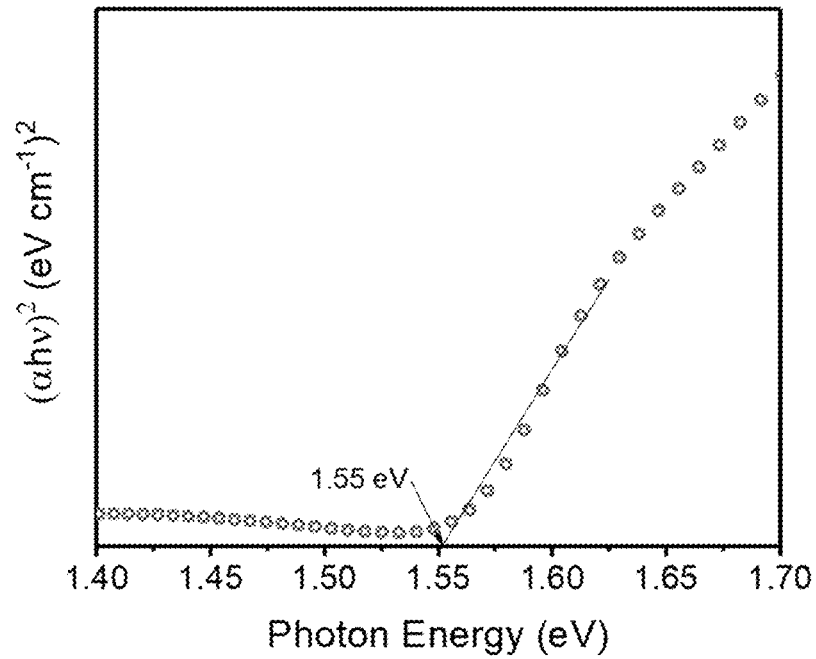
FIG. 7 shows Tauc plot of perovskite film.

Besides carrier dynamics and defect densities, the inventors also evaluate the morphology of perovskite films with and without passivator treatment via top-view Scanning Electron Microscopy (SEM). As shown in FIGS. 5A-5D, all the samples show indiscernible difference, demonstrating that the morphology of perovskite films is unaffected by the three types of passivation materials. The inventor subsequently investigates the optical properties of the perovskite films, which are as shown in FIG. 6, and it is discovered that there are no differences in the ultraviolet-visible spectra of the perovskite thin films with or without passivator. The value of bandgap ($E_g$) is also calculated to be 1.55 eV (as shown in FIG. 7).

Figure 8:
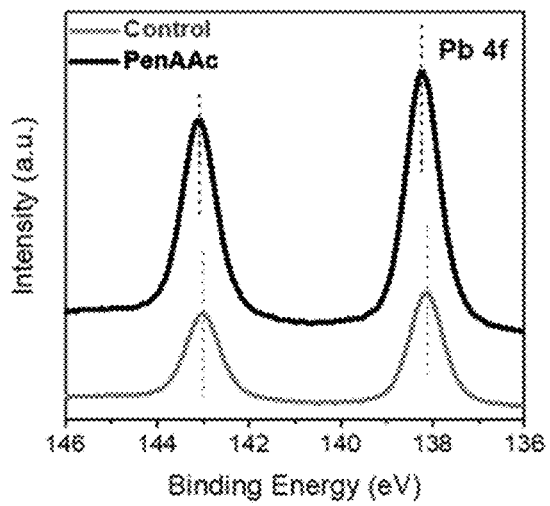
FIG. 8 shows XPS spectra of Pb element for the perovskite films with and without PenAAc.
Figure 9:
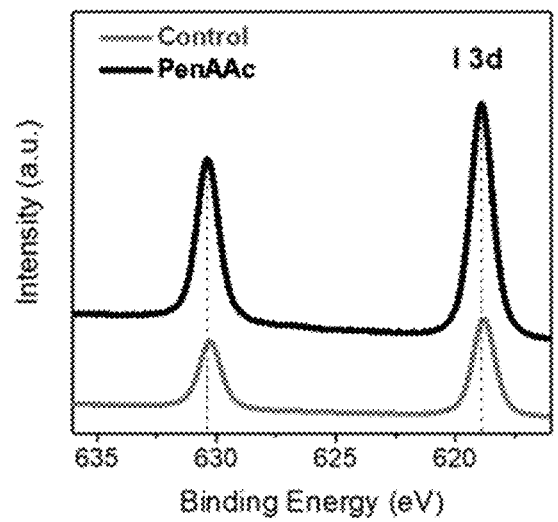
FIG. 9 shows XPS spectra of I element for the perovskite films with and without PenAAc.

Then, to study how PenAAc interacts with perovskite, we conduct X-ray photo-electron spectroscopy (XPS) measurements (FIGS. 8 and 9). For acquiring more accurate molecular interaction information, we deposit PenAAc molecules directly on the perovskite film surface and annealed them. The binding energies corresponding to the Pb 4f (138.24 eV and 143.08 eV) and I 3d (618.90 eV and 630.38 eV) core levels of the PenAAc-modified perovskite films all shift marginally to higher values compared with the Pb 4f (138.13 eV and 142.97 eV) and I 3d (618.78 eV and 630.26 eV) core levels of the control films, suggesting a reduced electron density of perovskite surface. The reason for this change may lie in the high electronegativity of the acetate that plays a determining role on the evolution of surface binding energy. This is also evidence of strong interaction between interfacial ions and Ac in PenAAc.

Figure 10:
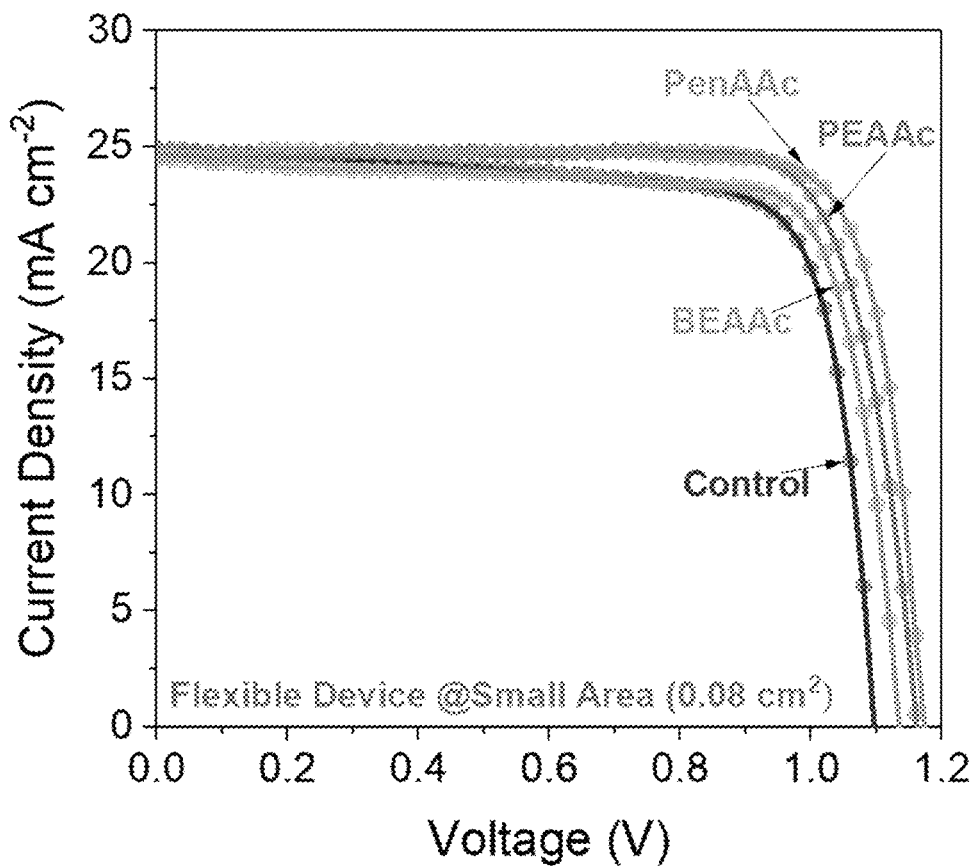
FIG. 10 shows J-V curves of flexible PSCs with different passivators.
Figure 11:
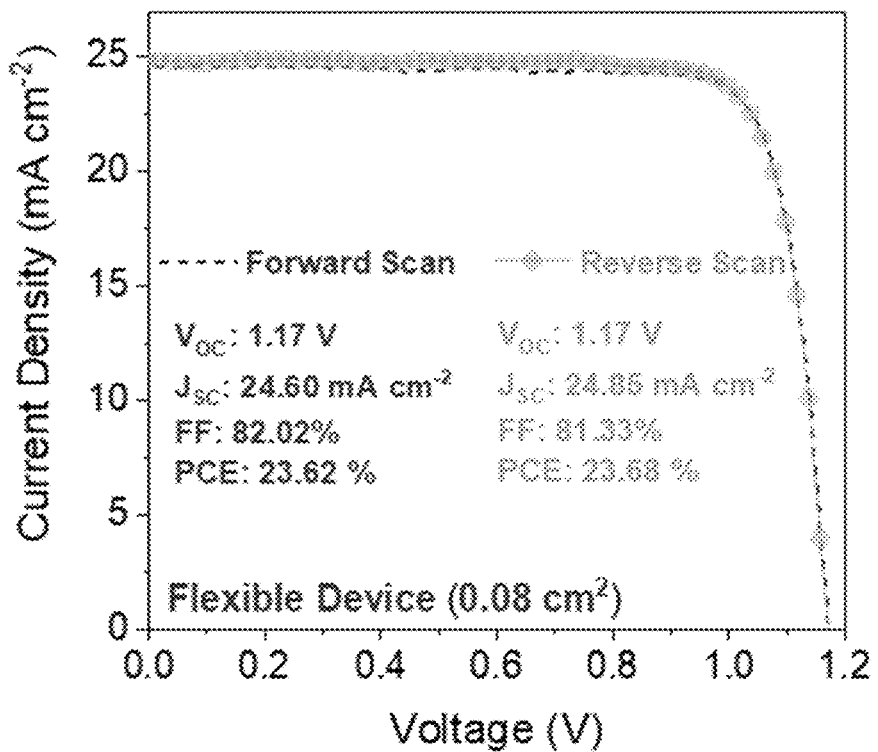
FIG. 11 shows J-V curves of the best performing PenAAc-modified flexible PSC (aperture area of 0.08 $cm^2$) under reverse and forward scans.
Figure 12:
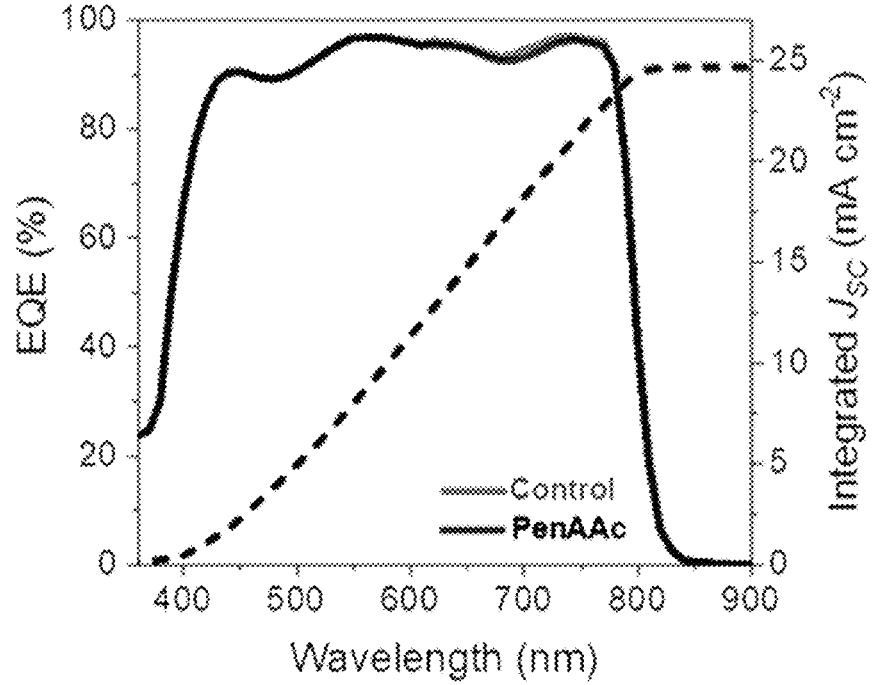
FIG. 12 shows EQE spectra of the best performing flexible PSC with and without PenAAc.

FIG. 10 shows the current density-voltage (J-V) curves of devices with different passivation molecules under AM 1.5 G simulated solar illumination (aperture area of 0.08 cm$^2$). The maximum PCE for the control device is 20.96%, with an open-circuit voltage (Voc) of 1.10 V, a short-circuit current density ($J_{sc}$) of 24.95 mA cm$^{-2}$, and a fill factor (FF) of 76.38%. Compared with the control device, the PEAAc and BEAAc modified devices show maximum PCEs of 22.98% and 21.84%, respectively. The champion device modified with PenAAc exhibits a significant enhanced PCE of 23.68%, with an increased Voc of 1.17 V. a $J_{sc}$ of 24.85 mA/cm$^2$ and an FF of 81.33%, showing extremely low hysteresis (FIG. 11). The integrated $J_{sc}$ of 24.61 mA cm$^{-2}$ obtained from the external quantum efficiency (EQE) spectra in FIG. 12 is virtually identical to the value obtained from the J-V measurements.

Figure 13:
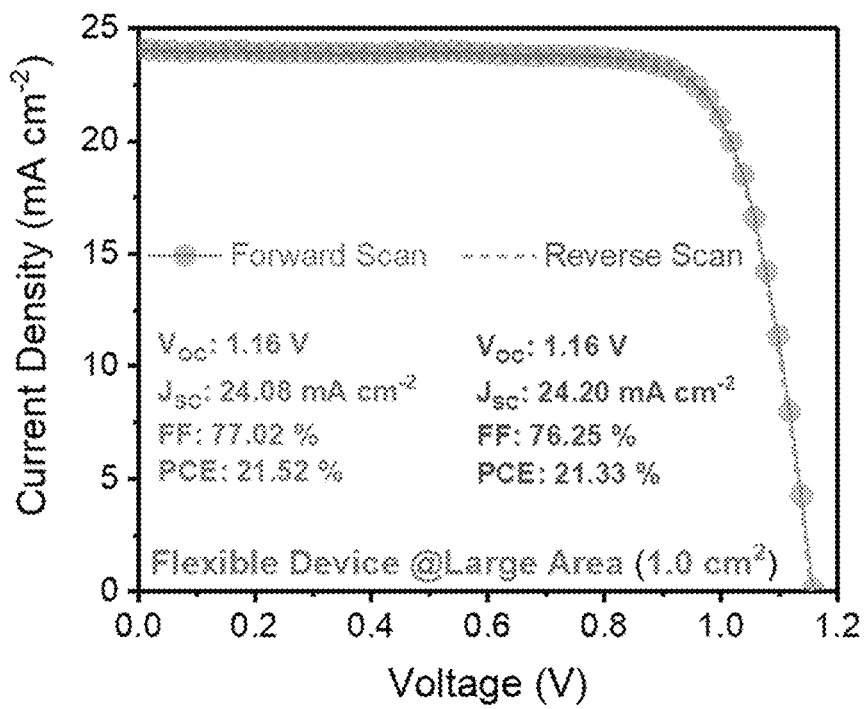
FIG. 13 shows J-V characteristics with different scan directions of large area (aperture area of 1.0 $cm^2$) flexible solar cells.
Figure 14:
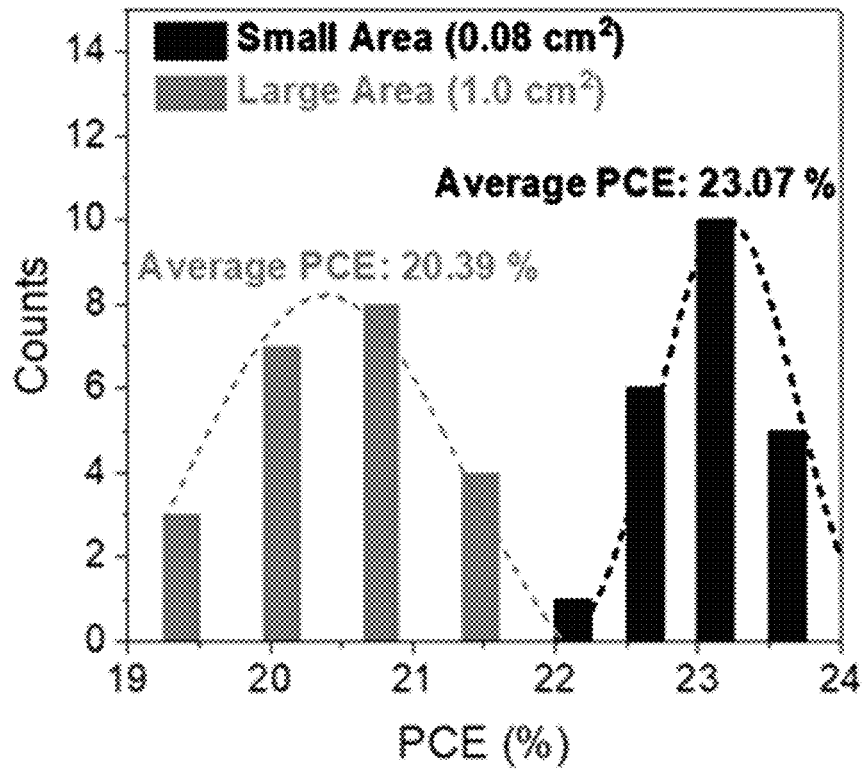
FIG. 14 shows histograms of the PCE values among 22 devices of small area (0.08 $cm^2$) and large area (1.0 $cm^2$) flexible PSCs, respectively.

In addition, we also fabricate large area (aperture area of 1.0 cm$^2$) flexible solar cells based on the above process optimization and achieve the highest PCE of 21.52% (FIG. 13). The PCEs also exhibit a satisfying reproducibility with an average PCE of 23.07% for the small area (aperture area of 0.08 cm$^2$) flexible devices, and 20.39% for the large area (aperture area of 1.0 cm$^2$) flexible devices, respectively (FIG. 14).

Figure 15:
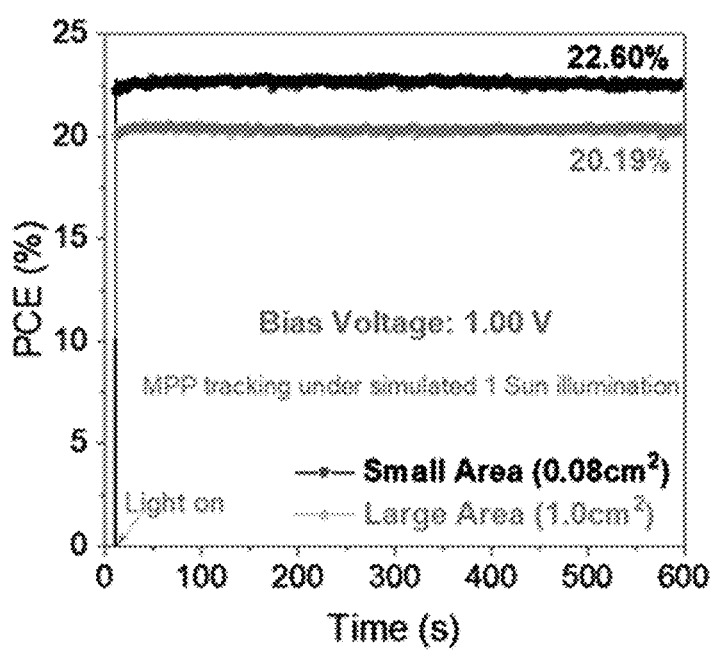
FIG. 15 shows stabilized photocurrent tracked of small area (0.08 $cm^2$) and large area (1.0 $cm^2$) flexible PSCs at its maximum power point (MPP) with a bias voltage of 1.00 V under 1 sun continuous illumination (AM 1.5G, 100 mW cm$^{-2}$)
Figure 16:
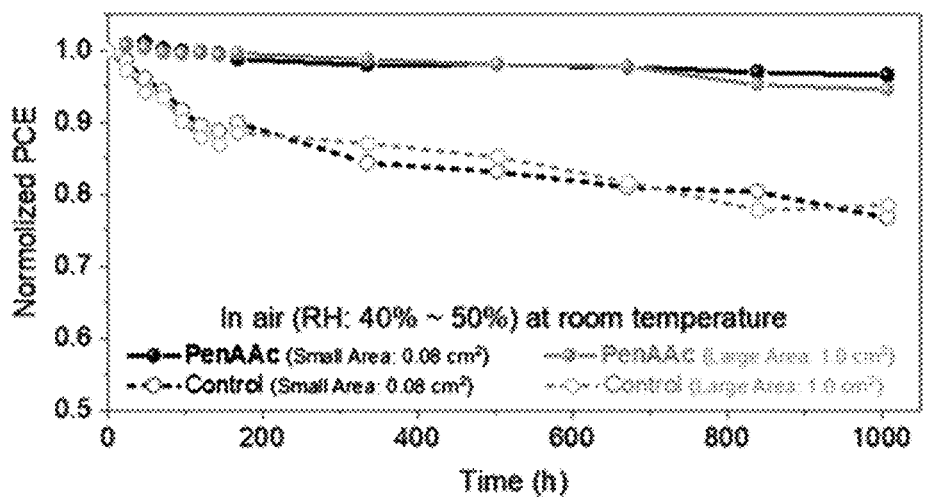
FIG. 16 shows results of stability test based on unencapsulated devices with and without PenAAc stored in ambient air (40-50% RH, 25° C.) in the dark.
Figure 17:
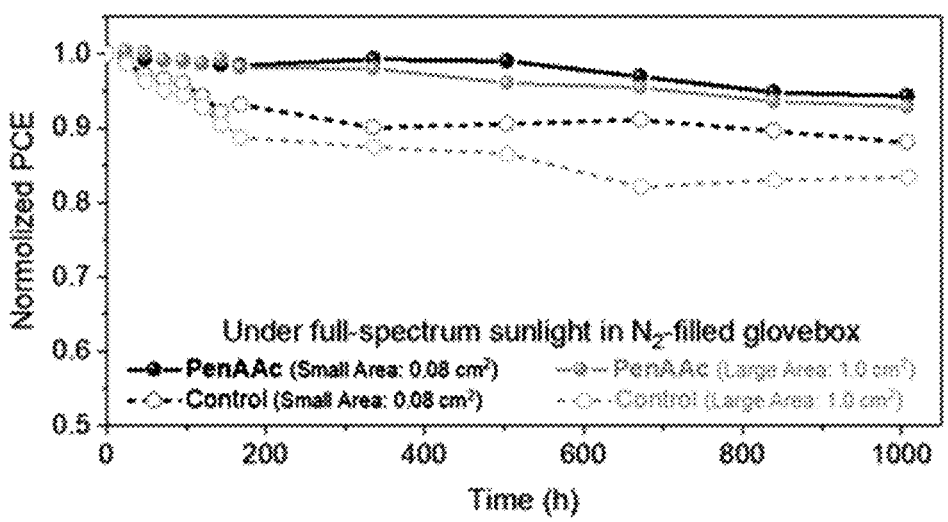
FIG. 17 shows results of stability test based on unencapsulated devices with and without PenAAc continue light illumination with 1 sun equivalent intensity.
Figure 18:
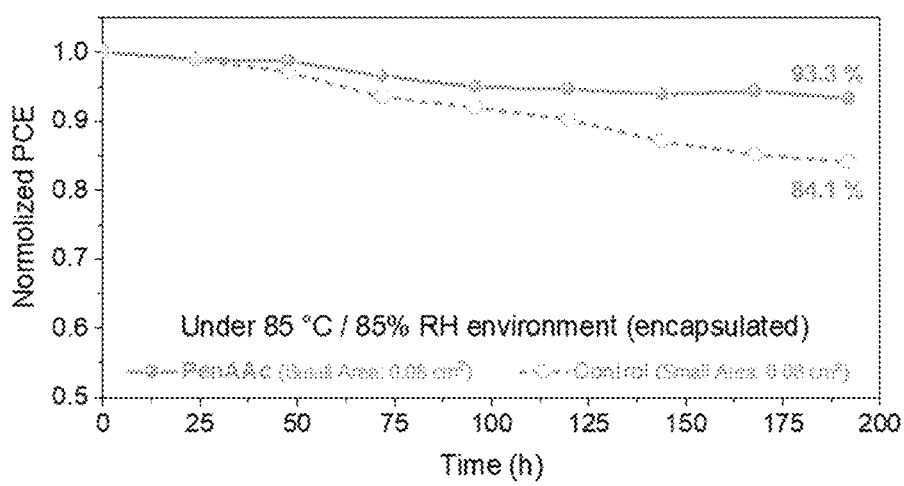
FIG. 18 shows results of stability test based on encapsulated devices with and without PenAAc under the condition of RH 85% at 85° C. in the dark.

The PenAAc-modified device is kept at its maximum power point (MPP) under 1 sun continuous illumination with a bias voltage of 1.00 V, which obtains a stabilized PCE of 22.60% (FIG. 15). Besides, we evaluate the long-term environmental stability of unencapsulated flexible PSCs by aging the devices in air with a relative humidity (RH) of 40%~50% at 25° C. (FIG. 16). After 1,000 h, the small area PenAAc-modified devices can retain 96.55% of their initial efficiency while the PCE of the control devices decreased to 76.71%. We examine the long-term light stability of devices with and without PenAAc under continuous white light-emitting diode (LED) illumination with the intensity of 1-sun equivalent as depicted in FIG. 17. After being illuminated for more than 1,000 h, the efficiencies of small area flexible PenAAc-modified device and control devices decrease to 94.31% and 88.09% of their initial values, respectively. In addition, we test the encapsulated devices under the condition of RH 85% at 85° C. in the dark, and PenAAc treated devices show better stability (FIG. 18).

Figure 19:
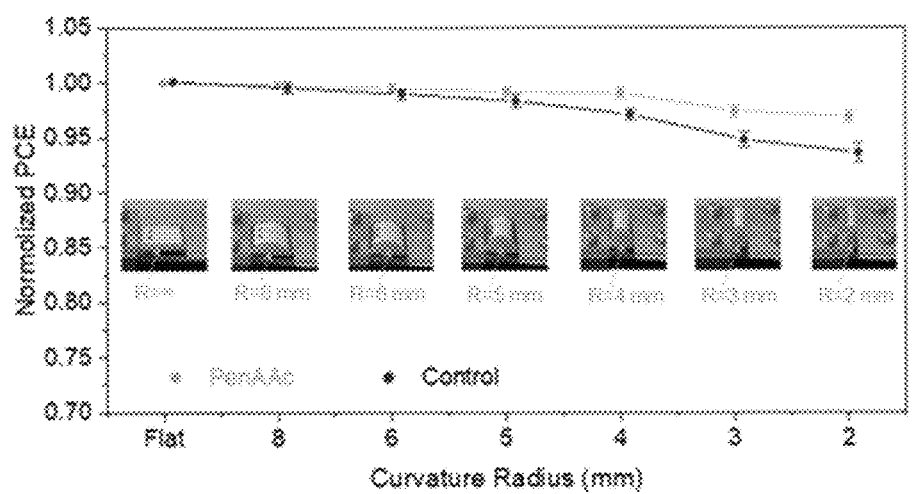
FIG. 19 shows PCE variance of flexible PSCs (0.08 cm$^2$) during mechanical bending test with different curvature radius.

Considering that under special circumstances, flexible solar cells need to be bent during operation, we carry out mechanical bending performance tests. FIG. 19 presents the efficiency variations during mechanical bending applied to flexible devices (aperture area of 0.08 cm$^2$) with different curvature radius. As the bending radius gradually decreases, there is no significant efficiency decline for the PenAAc-modified flexible device, which maintains 98% of its initial efficiency (better than 96% of the control device) even when the radius is as small as 2 mm.

Figure 20:
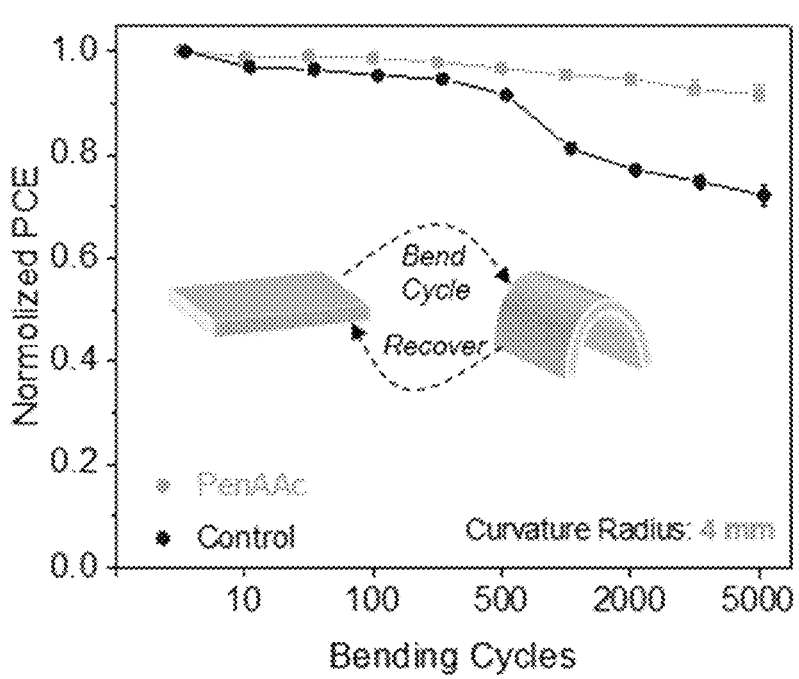
FIG. 20 shows results of efficiency evolution of flexible PSCs (0.08 cm$^2$) as a function of mechanical bending cycles at a curvature radius of 4 mm.
Figure 21A:
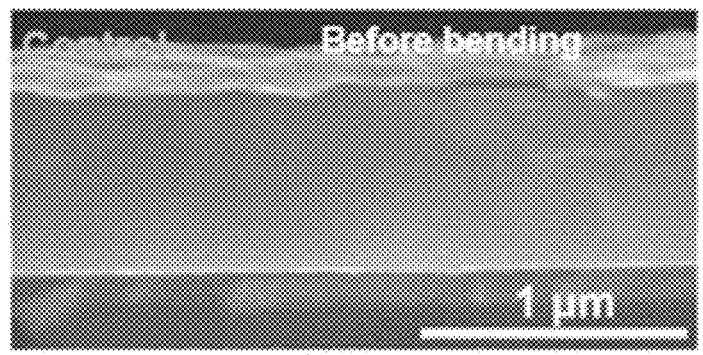
FIG. 21A shows a cross-sectional SEM image of control flexible solar cells before bending.
Figure 21B:
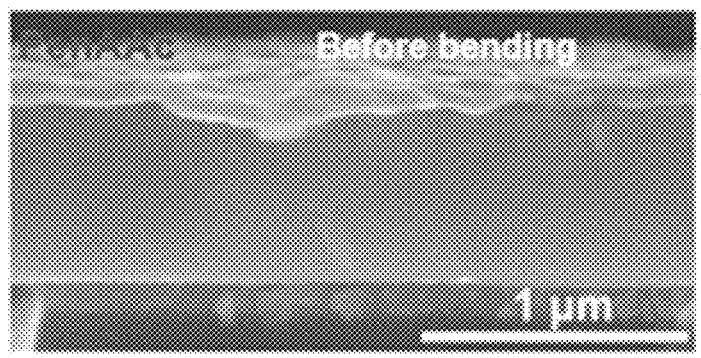
FIG. 21B shows a cross-sectional SEM image of PenAAc based fresh flexible solar cells before bending.
Figure 21C:
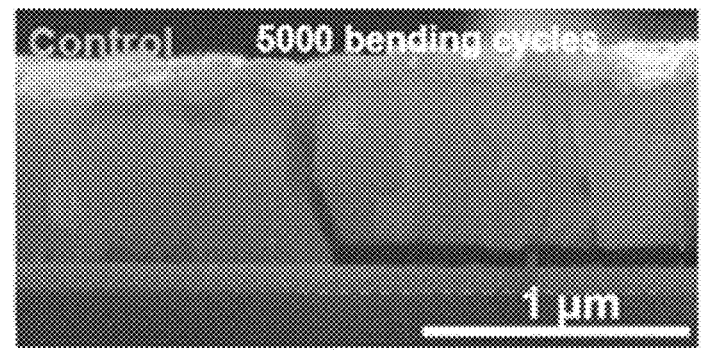
FIG. 21C shows a cross-sectional SEM image of control flexible solar cells after 5,000 bending cycles.
Figure 21D:
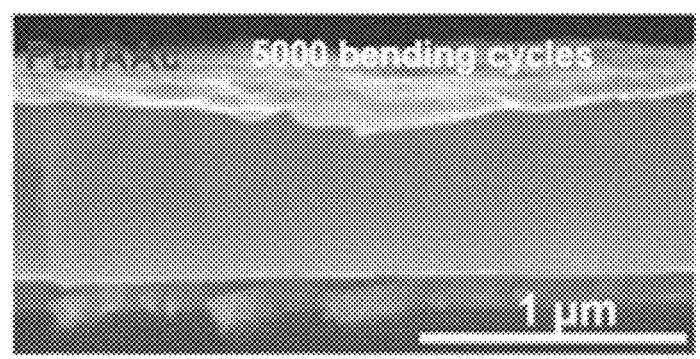
FIG. 21D shows a cross-sectional SEM image of PenAAc based flexible solar cells after 5,000 bending cycles.

We also assess the performance evolution of the PenAAc-modified flexible PSCs through a multiple-cycle bending test. With a radius of 4 mm, 5,000 continuous bending cycles are performed (FIG. 20). The flexible PSCs based on PenAAc-modified exhibit promising mechanical bending stability. The efficiency remains above 91% of the initial value even after 5,000 cycles of bending. In comparison, the control PSCs only keeps 90% of their original efficiency after 500 cycles of bending. As further increased the number of cycles to 5,000, the control device remains only 73% of its initial value. The function of the passivation molecule is to modulate the strain and deformation of the perovskite lattice which is nanometer-sized and matches the diameter of the passivation molecule. To further verify our hypothesis, we used SEM to observe the cross-section of the flexible device before and after 5,000 bending tests (FIGS. 21A-21D). We find that both the control and PenAAc-treated perovskite films are in close contact with the underlying surface layer before the bending tests. However, after 5,000 bending cycles, delamination is found at the bottom of the perovskite film of the control device, and cracks appeared in the perovskite layer (red line area in FIG. 21B). On the contrary, there is no obvious change at the interface of the film treated with PenAAc.

It should be understood that the above only illustrates and describes examples whereby the present invention may be carried out, and that modifications and/or alterations may be made thereto without departing from the spirit of the invention.

It should also be understood that certain features of the invention, which are, for clarity, described in the context of separate embodiments, may also be provided in combination in a single embodiment. Conversely, various features of the invention which are, for brevity, described in the context of a single embodiment, may also be provided separately, or in any suitable subcombination.

All references specifically cited herein are hereby incorporated by reference in their entireties. However, the citation or incorporation of such a reference is not necessarily an admission as to its appropriateness, citability, and/or availability as prior art to/against the present invention.

REFERENCES

[1] X. Hu, X. Meng, X. Yang, Z. Huang, Z. Xing, P. Li, L. Tan, M. Su, F. Li, Y. Chen, *Science Bulletin,* 2021, 66, 527-535.
[2] X. Meng, Z. Xing, X. Hu, Z. Huang, T. Hu, L. Tan, F. Li, Y. Chen, *Angew. Chem. Int. Ed.,* 2020, 59, 16602-16608.
[3] H. Mei, Y. Wu, C. Wang, S. Ren, M. Zhang, H. Dai, D. Zhao, Z. Li, Q. Du, X. Li, *J. Mater. Chem.* A, 2020, 8, 19425-19433.
[4] Q. Dong, M. Chen, Y. Liu, F. T. Eickemeyer, W. Zhao, Z. Dai, Y. Yin, C. Jiang, J. Feng. S. Jin. *Joule.* 2021, 5, 1587-1601.

What is claimed is:

1. A perovskite solar cell comprising
a perovskite layer; and
an interface modification layer that is in contact with the perovskite layer and comprises at least one ammonium acetate, wherein the at least one ammonium acetate comprises pentylammonium acetate.

2. The perovskite solar cell of claim 1, wherein the interface modification layer further comprises at least one ammonium acetate selected from the group consisting of phenylethylammonium acetate, 2-([1,1'-biphenyl]-4-yl) ethan-1-amine acetate, butanammonium acetate, hexylammonium acetate, octylammonium acetate, phenylbutanammonium acetate, and any combination thereof.

3. The perovskite solar cell of claim 1, further comprising a perovskite layer comprising a perovskite composition having the empirical formula:

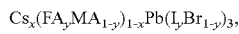

$Cs_x(FA_yMA_{1-y})_{1-x}Pb(I_yBr_{1-y})_3$, wherein x is from about 0 to about 0.15;
wherein y is from about 0.85 to about 1;
wherein FA is formamidinium; and
wherein MA is methylamine.

4. The perovskite solar cell of claim 1, wherein the perovskite solar cell is an inverted flexible perovskite solar cell comprising:
a. a flexible substrate layer;
b. a transparent electrode on the flexible substrate layer;
c. a hole transport layer positioned between the transparent electrode and the interface modification layer;
d. an electron transport layer on the perovskite layer;
e. a metal electrode on the electron transport layer; and
f. optionally a buffer layer positioned between the electron transport layer and the metal electrode.

5. The perovskite solar cell of claim 4, wherein the flexible substrate layer comprises a material selected from the group consisting of PET, PEN, CPI, and a combination thereof.

6. The perovskite solar cell of claim 4, wherein the transparent electrode comprises a material selected from the group consisting of ITO, FTO, Ag nanowires, and a combination thereof.

7. The perovskite solar cell of claim 4, wherein the hole transport layer comprises a material selected from the group consisting of PEDOT:PSS, PTAA, and a combination thereof.

8. The perovskite solar cell of claim 4, wherein the electron transport layer comprises a material selected from the group consisting of $C_{60}$, $TiO_2$, $SnO_2$, $PC_{61}BM$, $PC_{72}BM$, and a combination thereof.

9. The perovskite solar cell of claim 4, comprising a structure of polyethylene naphthalenediate/indium tin oxide/ poly(triaryl amine)/pentylammonium acetate/perovskite/ $C_{60}$/2,9-dimethyl-4,7-diphenyl-1,10 phenanthroline/silver in sequence.

10. A method of preparing an inverted perovskite solar cell comprising the steps of:
providing a flexible substrate layer;
providing a transparent electrode on the flexible substrate layer;
coating a hole transport layer onto the substrate layer;
coating a perovskite layer;
coating an electron transport layer onto the perovskite layer;
coating a metal electrode on the electron transport layer;
wherein, an interface modification layer is coated onto the hole transport layer, prior to coating the perovskite layer, or is coated on both sides of the perovskite layer; and
wherein the interface modification layer comprises at least one ammonium acetate, wherein the at least one ammonium acetate comprises pentylammonium acetate.

11. The method of claim 10, wherein the perovskite layer comprises a perovskite composition having the empirical formula:

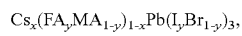

$Cs_x(FA_yMA_{1-y})_{1-x}Pb(I_yBr_{1-y})_3$, wherein x is from about 0 to about 0.15;
wherein y is from about 0.85 to about 1;
wherein FA is formamidinium; and
wherein MA is methylamine.

12. The method of claim 10, wherein the flexible substrate layer comprises a material selected from the group consisting of PET, PEN, CPI, and a combination thereof; the transparent electrode comprises a material selected from the group consisting of ITO, FTO, Ag nanowires, and a combination thereof; the hole transport layer comprises a material selected from the group consisting of PEDOT:PSS, PTAA, and a combination thereof; and the electron transport layer comprises a material selected from the group consisting of $C_{60}$, $TiO_2$, $SnO_2$, $PC_{61}BM$, $PC_{72}BM$, and a combination thereof.

13. The method of claim 10, wherein the step of coating the hole transport layer comprises:
spin-coating a solution comprising about 0.5 to about 4 mg/mL hole transport material onto the substrate at a speed of about 3,500 to about 5,000 rpm for about 20 to about 60 seconds and
subsequently annealing at a temperature of about 90° C. to about 110° C. for about 10 to about 15 min.

14. The method of claim 10, wherein the step of coating the perovskite layer comprises:
preparing a perovskite precursor solution by mixing CsI, FAI, MABr, $PbI_2$ and $PbBr_2$ in DMF:DMSO (from about 4:1/v:v to about 9:1/v:v) mixed solvent with a perovskite composition having the empirical formula $Cs_x(FA_yMA_{1-y})_{1-x}Pb(I_yBr_{1-y})_3$, and adding about 8 mol % to about 37 mol % of MACl and about 0.2 mol % to about 1.4 mol % of ODADI into the solution;

dropping the perovskite precursor solution on the hole transport layer and spin-coated at a speed of about 350 to about 1,800 rpm for about 5 to about 20 seconds, and subsequently at about 3,500 to about 7,000 rpm for about 30 to about 60 seconds; and annealing at a temperature from about 90° C. to about 160° C. for about 7 min to about 50 min.

15. The method of claim 10, wherein the interface modification layer is prepared by spinning a solution comprising at least one ammonium acetate in a concentration of about 0.4 to about 2.5 mg/mL onto the hole transport layer or the perovskite layer.

16. The method of claim 15, wherein the solution comprising at least one ammonium acetate is spin-coated at a speed of about 4,000 to about 5,000 rpm for about 30 seconds.

17. The method of claim 15, wherein the spin-coated solution is subsequently annealed at a temperature of about 90° C. to about 110° C. for about 10 min to about 15 min.

18. The method of claim 10, wherein the interface modification layer further comprises at least one ammonium acetate selected from the group consisting of phenylethylammonium acetate, 2-([1,1'-biphenyl]-4-yl) ethan-1-amine acetate, butanammonium acetate, hexylammonium acetate, octylammonium acetate, phenylbutanammonium acetate, and any combination thereof.

19. A method for passivating a perovskite layer in an inverted flexible perovskite solar cell, comprising providing an interface modification layer comprising an ammonium acetate on the bottom side or both sides of the inverted flexible perovskite layer, wherein the ammonium acetate comprises pentylammonium acetate.

20. The method of claim 19, wherein the interface modification layer further comprises an ammonium acetate selected from the group consisting of phenylethylammonium acetate, 2-([1,1'-biphenyl]-4-yl) ethan-1-amine acetate, butanammonium acetate, hexylammonium acetate, octylammonium acetate, phenylbutanammonium acetate, and any combination thereof.

* * * * *